United States Patent [19]

Asano et al.

[11] Patent Number: 4,933,685

[45] Date of Patent: Jun. 12, 1990

[54] IMAGE TRANSFER SYSTEM WITH PRELIMINARY-EXPOSURE DEVICE

[76] Inventors: Yuki Asano, 2-4, Momozono-cho, Mizuho-ku, Nagoya-shi, Aichi-ken; Akira Sago, 1-37, Hakuryu-cho, Mizuho-ku, Nagoya-shi, Aichi-ken; Masashi Ueda, 85-58, Aza-Ukishima, Atsutahigashi-cho, Mizuho-ku, Nagoya-shi, Aichi-ken; Osamu Takagi, 1-37, Hakuryu-cho, Mizuho-ku, Nagoya-shi, Aichi-ken; Yumio Matsumoto, 19-18, Shirayama-cho, 6-chome, Kasugai-shi, Aichi-ken; Kiyoharu Hayakawa, 269, Aza-Ryuto, Oaza-Sakogishinden, Yatomi-cho, Ama-gun Aichi-ken; Kenji Sakaibara, 32, Aza-Yashiki, Oaza-Sachihara, Ichinomoya-shi, Aichi-ken; Tokunori Katoh, 1206, Asamiya, Hagiwara-cho, Ichinomiya-shi, Aichi-ken; Shigeyuki Hayashi; Michitoshi Akao, both of 3-27, Shimosaka-cho, Mizuho-ku, Nagoya-shi, Aichi-ken; Jun Sakai, 8-12, Sakurada-cho, Atsuta-ku, Nagoya-shi, Aichi-ken, all of Japan

[21] Appl. No.: 182,190

[22] Filed: Apr. 15, 1988

[30] Foreign Application Priority Data

| Mar. 4, 1986 [JP] | Japan | 61-47018 |
| Jun. 2, 1986 [JP] | Japan | 61-82508 |
| Jun. 13, 1986 [JP] | Japan | 61-136187 |
| Apr. 17, 1987 [JP] | Japan | 62-95985 |
| Jun. 10, 1987 [JP] | Japan | 62-89133[U] |
| Jul. 22, 1987 [JP] | Japan | 62-112153[U] |
| Jul. 29, 1987 [JP] | Japan | 62-116111[U] |

[51] Int. Cl.$^5$ .......... G01D 9/00; G01D 9/42; G03B 27/00
[52] U.S. Cl. .......... 346/1.1; 346/110 R; 346/108; 346/107 R; 346/76 L; 355/20; 355/18; 355/302
[58] Field of Search .......... 346/1.1, 110 R, 108, 346/107 R, 76 L; 355/20, 18; 358/302

[56] References Cited

U.S. PATENT DOCUMENTS

| 4,664,506 | 5/1987 | Seki et al. | 355/20 |
| 4,712,909 | 12/1987 | Oshikoshi | 355/20 |
| 4,786,944 | 11/1988 | Sakamoto et al. | 355/20 |

FOREIGN PATENT DOCUMENTS

| 1512484 | 6/1978 | United Kingdom . |
| 2135468 | 8/1984 | United Kingdom . |
| 2159973 | 12/1985 | United Kingdom . |

Primary Examiner—Bruce A. Reynolds
Assistant Examiner—Huan Tran
Attorney, Agent, or Firm—Oliff & Berridge

[57] ABSTRACT

A method and an apparatus of exposing a photosensitive medium for forming thereon a latent image which corresponds to an original image to be reproduced and which is developed into a visible image. The photosensitive medium has a basic minimum amount of exposure to a radiation, below which a density of the visible image remains constant and above which the density varies with an amount of exposure to the radiation. An entire recording surface of the photosensitive medium is evenly exposed to a first radiation by a predetermined first exposure amount determined by the basic minimum amount, and each label area of the recording surface is exposed to a second radiation by a second exposure amount which corresponds to a density in a corresponding local area of the original image, so that the first and second exposure amounts cooperate to form the latent image.

12 Claims, 19 Drawing Sheets

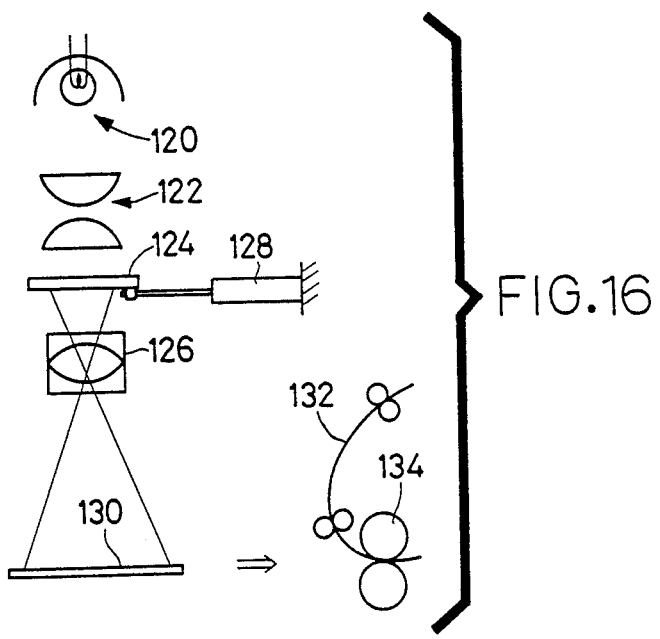
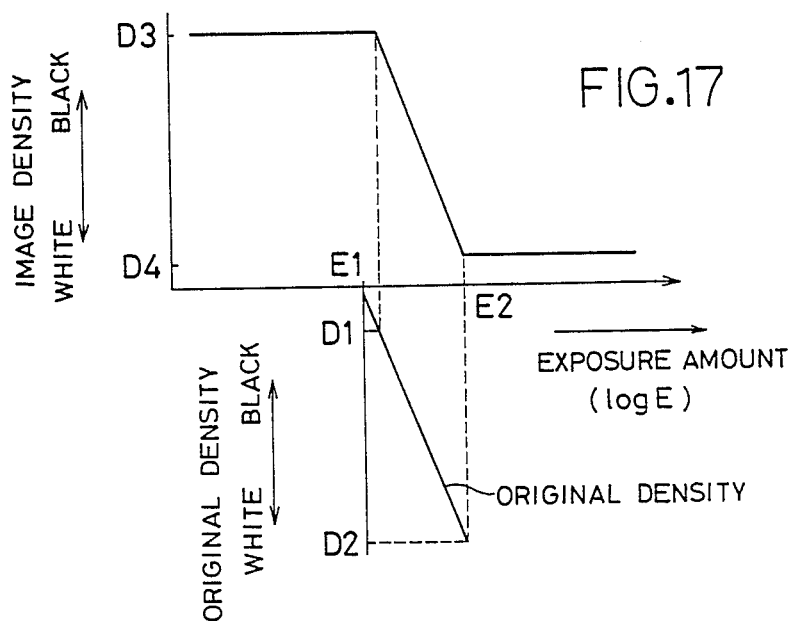
FIG. 16
FIG. 17

1

IMAGE TRANSFER SYSTEM WITH PRELIMINARY-EXPOSURE DEVICE

BACKGROUND OF THE INVENTION

1. Field of the Invention

The present invention relates generally to an image transfer system, and more particularly to a technique for improving the durability of an exposure device of the system for exposing a photosensitive medium to a radiation.

2. Discussion of the Prior Art

There is known an image transfer system using a photosensitive material as a recording medium, on which images are formed with a density that is varied in a certain range according to a variation in an amount of light exposure of the photosensitive material. The lower limit of the range in which the density is variable is determined as a basic minimum amount of light exposure necessary to produce an image visible to the unaided eye. In this type of an image transfer system, images are transfered to the photosensitive medium by exposing the medium to a radiation in response to appropriate image signals. An example of such an image transfer system is schematically illustrated in FIG. 5. In the figure, reference numeral 90 generally indicates a CRT (cathode ray tube) which has a faceplate 92, a fluorescent screen 94 disposed inside the faceplate 92, and an electron gun 96 which produces a beam of electrons 98 toward the fluorescent screen 94. The electron beam 98 emitted by the electron gun 96 is deflected or swept by a deflection coil 100 within a predetermined angular range in a horizontal plane. The intensity of the beam 98 is controlled by a driver circuit (not shown). The fluorescent screen 94 emits a horizontal scanning line of light when struck by a corresponding horizontal line of the electron beam 98 that represents a line of picture elements. Usually, a multiplicity of such horizontal lines correspond to a certain image or a line of images.

The horizontal line of light emitted by the fluorescent screen 94 is converted by an optical filter 102 into a light having a wavelength band to which a photosensitive paper 104 is sensitive. Then, the light is focused on the photosensitive paper 104, by an optical focusing device 106. The photosensitive paper 104 is fed on a support 108 by feed rollers 110, at a speed corresponding to a rate at which successive lines of light are emitted by the fluorescent screen 94. In this manner, latent images are formed on the photosensitive paper 104. If silver chloride is used for a photosensitive material of the photosensitive paper 104, the exposed paper 104 is fed through a developing device 112 for development of the latent images with a developing liquid. If the photosensitive paper 104 is a light- and pressure-sensitive paper which includes microcapsules made of a radiation-curable resin, the image-wise exposed paper 104 is fed through a pressure nip between pressure rollers 114 as a developing device.

In a commonly used photosensitive paper, the density of images formed on the paper is varied according to an amount of exposure to a radiation, only after the paper is exposed to a predetermined basic minimum amount of radiation. For example, in the case of a silver chloride photosensitive paper, the image density is varied within a range B indicated in FIG. 6. In the case of a light- and pressure-sensitive paper using microcapsules made of a radiation-curable resin, the image density is varied within a range B indicated in FIG. 7. In both cases, the image density is changed after the photosensitive medium is exposed to a certain amount of light exposure, i.e., basic minimum amout E1. Accordingly, the formation of latent images on the photosensitive medium requires the fluorescent screen 94 of the CRT 90 to emit a radiation whose intensity must cover the entirety of the density-variable range B, the lower limit E1 of which is considerably high. In other words, the light source for exposing the recording medium, i.e., the CRT 90, must have a minimum luminance capacity equivalent to the basic minimum light exposure E1. Hence, the light source must have a relatively large capacity, and is relatively less durable in operation.

In the case where the above-indicated image transfer system is adapted to form color images, a color balance of the images may be unfavorably changed due to a difference in sensitivity of three types of microcapsules to respective radiation wavelengths corresponding to the three primary colors of light, and/or a fluctuation in the operating characteristics of the corresponding three light sources due to a variation in line voltage and/or ambient temperature. Accordingly, the conventional color image transfer system must be adjusted for consistency of the color balance before the system is shipped. This adjustment takes considerable time and labor, increasing the cost of the system. The color balance adjustment requires control circuits or devices for changing the intensities of the light sources for the three primary colors of light, and/or the relative lengths of times of irradiation of the three different wavelengths. Such control circuits and devices also push up the cost of the system.

SUMMARY OF THE INVENTION

It is therefore an object of the present invention to provide an image transfer system wherein a photosensitive medium is image-wise exposed, with a light source device which has a reduced capacity and an improved durability.

Another object of the invention is to provide a color image transfer system using a photosensitive medium, which permits easy color balance adjustments.

According to the present invention, there is provided an image transfer system wherein latent images are formed on a photosensitive medium by exposure to a radiation according to image signals, and are developed into visible images, the photosensitive medium having a basic minimum amount of exposure to the radiation, which substantially defines a lower limit of a density-variable range in which a density of the visible images is varied according to an amount of exposure of the photosensitive medium to the radiation, the present image transfer system includes a first device, a second device and a developing device. The first device is adapted to expose the photosensitive medium to the radiation by a predetermined basic amount not larger than the basic minimum amount. The second device is adapted to expose local areas of the photosensitive medium to a controlled intensity of the radiation represented by the image signals, and thereby cooperate with the first device to form the latent images on the photosensitive medium. The latent images formed on the photosensitive medium are developed into the visible images by the developing device.

In the image transfer system of the present invention constructed as described above, the photosensitive medium is exposed by the first device and the second device. Accordingly, the amount of exposure of the photosensitive medium given by the second device is the total amount of exposure of the medium to the radiation, less the predetermined basic amount given by the first device. Therefore, the instant image transfer system requires the second device to produce a relatively reduced amount of radiation, thereby lowering a required luminance of a light source for the second device. Consequently, the latent images can be efficiently formed, with minimum deterioration of the light source, and the durability of the light source is improved.

According to one feature of the present invention, the photosensitive medium contains three different kinds of photosensitive materials which are sensitive to different wavelengths of the radiation corresponding to three primary colors, the first device exposing the photosensitive medium to the different wavelengths by different basic amounts.

Preferably, the photosensitive medium used in the present image transfer system consists of a substrate, a developer layer formed on the substrate, and a multiplicity of microcapsules formed on or embedded in the developer layer. Each microcapsule includes: a photosensitive resin which is curable by polymerization upon exposure to light; a colorless chromogenic material (color former) which reacts with the developer layer to form a visible image spot; and a photoinitiator for promoting the polymerization of the chromogenic material. The microcapsule may be covered with a suitable outer coating. Upon exposure to a radiation from the second device, the photosensitive resin of the microcapsules in the exposed areas of the photosensitive medium is polymerized and is thus cured, while the photosensitive resin of the microcapsules in the unexposed areas remains uncured. The latent images on the photosensitive medium are developed into the visible image by the developing device, which is adapted to rupture the uncured microcapsules by applying a pressure, friction or heat. That is, when the uncured microcapsules are ruptured by the developing device, the chromogenic materials come out of the ruptured microcapsules and react with the developer layer, producing the visible image spots or dots on the photosensitive medium. This type of photosensitive medium is referred to as "self-activated type". In the case where the radiation-curable resin of the photosensitive medium is cured upon exposure to light, the images represented by the image signals are reversed with respect to the visible images developed on the photosensitive medium. However, if the photosensitive medium has microcapsules whose base resin is softened or becomes brittle upon exposure to light, the visible images formed on the photosensitive medium are not reversed to the images represented by the image signals. In the latter case, the photosensitive resin of the microcapsules may consist of 3-oximino-2-butanone methacrylate which undergoes main chain scission upon light exposure, or poly 4'-alkyl acylo-phenones.

The color of the visible images formed on the photosensitive medium is determined by the chromogenic material contained in the microcapsules, and is not directly affected by the wavelength of the radiation to which the photosensitive resin of the microcapsules is sensitive. Hence, the color of the visible images is generally different from that of the corresponding images displayed on a cathode ray tube, for example, which is used as the second device. Where the second device consists of a cathode ray tube, the tube is adapted to emit a radiation in the non-visible spectra.

According to another feature of the present invention, the photosensitive medium contains three different photosensitive materials which are sensitive to different radiation wavelengths corresponding to three primary colors. In this case, the first device is adapted to expose the photosensitive medium to the different wavelengths by different basic amounts.

In one form of the above feature of the invention, the first device includes a single light source, and a filter device including three filters operable for converting the radiation from the single light source into three rays of light having the different wavelengths. This arrangement is used with a photosensitive medium for color imaging The three filters, which are adapted to the three primary colors of the visible images, make it possible to establish a desired color balance of the visible images on the photosensitive medium.

According to a further feature of the invention, the first device is adapted to expose the medium either before or after the second device exposes the medium.

According to a still further feature of the invention, the second device comprises a cathode ray tube operable to successively emit lines of light representative of corresponding lines of picture elements according to the image signals, and an optical focusing device disposed between the cathode ray tube and the photosensitive medium, for focusing the lines of light on the photosensitive medium.

According to another aspect of the present invention, there is provided an image transfer system wherein visible images are formed on a photosensitive medium according to image signals, comprising: (a) a light source in the form of a bar for emitting a line of light; (b) a waveguide for directing the line of light toward the photosensitive medium; (c) a rotary filter device having a plurality of filter elements which are selectively brought into alignment with the waveguide by rotation of the rotary filter device about an axis thereof parallel to the light source, the three filter elements permitting components of the line of light having specific wavelengths, to pass therethrough and through the waveguide, the filter elements extending parallel to the axis of rotation of the filter device; and (d) an optical switch array having a plurality of optical switches which are selectively opened according to the image signals, so as to permit the components of the light from the waveguide to pass through the selectively opened optical switches to expose corresponding areas of the photosensitive medium.

The image transfer system according to the above aspect of the invention is suitably used for color imaging. In this case, the filter elements correspond to three primary colors of light, and are selectively aligned with the waveguide by rotating the filter device about its axis. According to this arrangement, a difference in sensitivity of the photosensitive medium to the different radiation wavelengths corresponding to the three primary colors and/or a fluctuation in the operating characteristics of the light source, can be compensated for by adjusting the surface areas of the individual filter elements, and/or the speeds at which the filter elements are moved past the waveguide (by controlling the rotating speed of the rotary filter device for each filter element). Thus, the instant image transfer system using the single light source is capable of easily establishing a desired color balance of the color images, with the rotary filter device which is relatively simple in construction.

According to one feature of the above aspect of the invention, each of the filter elements has a generally rectangular stationary shield fixed thereto for interrupting the line of light from the light source. The shield extends parallel to the axis of rotation of the rotary filter device and has a width smaller than the each filter element.

In one form of the above feature of the invention, the stationary shield overlaps a portion of the each filter element as seen in a direction of rotation of the filter device.

In accordance with another form of the same feature of the invention, each filter element further has a generally rectangular movable shield which extends parallel to the axis of rotation of the rotary filter device and has a smaller width than the each filter element in the direction of rotation. The movable shield is supported movably relative to the corresponding filter element in a direction of rotation of the filter device, so as to overlap a portion of the each filter element for interrupting the line of light from the light source.

According to a further feature of the above aspect of the invention, each of the filter elements is inclined a predetermined angle relative to the line of light from the light source when the each filter is aligned with the waveguide. The filter element has a substantially parallelogrammic shape as seen in a direction of propagation of the line of light through the waveguide.

BRIEF DESCRIPTION OF THE DRAWINGS

The above and other objects, features and advantages of the present invention will become more apparent by reading the following detailed description of some preferred embodiments of the invention, when considered in connection with the accompanying drawings, in which:

FIGS. 16-18 are views showing a still further embodiment of the invention adapted to record a monochrome image, FIG. 16 showing a first exposing step while FIG. 18 showing a second exposing step, and FIG. 17 illustrating a photosensitive characteristic of a photosensitive paper exposed in the first and second exposing steps of FIGS. 16 and 18;

DETAILED DESCRIPTION OF THE PREFERRED EMBODIMENTS

To further clarify the concept of the present invention, some preferred embodiments of the invention will be described in detail, by reference to the accompanying drawings.

Figure 1:
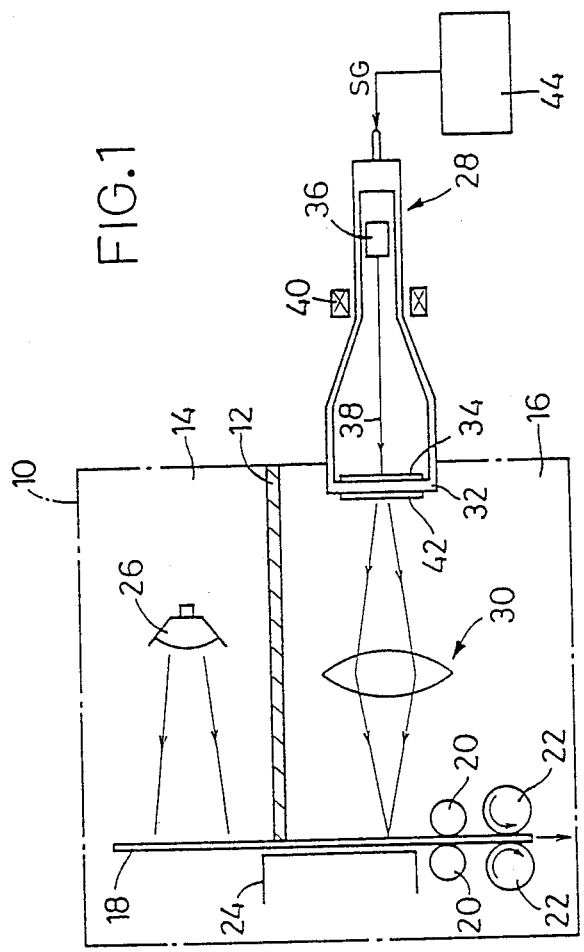
FIG. 1 is a schematic view of one embodiment of an image transfer system of the present invention.

Referring first to FIG. 1, reference numeral 10 designates a frame of an image transfer system. The frame 10 is divided by a partition wall 12 into a first darkroom 14 and a second darkroom 16 Within the frame 10, there is provided a paper path along which a photosensitive paper 18 is advanced by means of feed rollers 20. Downstream of the feed rollers 20, there are disposed developing pressure rollers 22 which will be described. The photosensitive paper 18 is fed from a storage tray (not shown) and moved on a support 24 in a direction from the first darkroom 14 toward the second darkroom 16. The processed paper 18 is finally discharged out of the frame 10. As described later in greater detail, the photosensitive paper 18 is image-wise exposed while being fed through the darkrooms 14, 16. The exposed paper 18 is further fed through a pressure nip between the pressure rollers 22, under a predetermined squeezing surface pressure The photosensitive paper 18 used in the present embodiment has a layer of microcapsules containing a chromogenic or photosensitive composition. The microcapsules are selectively ruptured during a pass of the photosensitive paper 18 through the pressure nip of the rollers 22, whereby images are formed at selected local areas on the paper 18, as discussed below. In the present embodiment, therefore, the pressure rollers 22 serve as a developing device.

Figure 2:
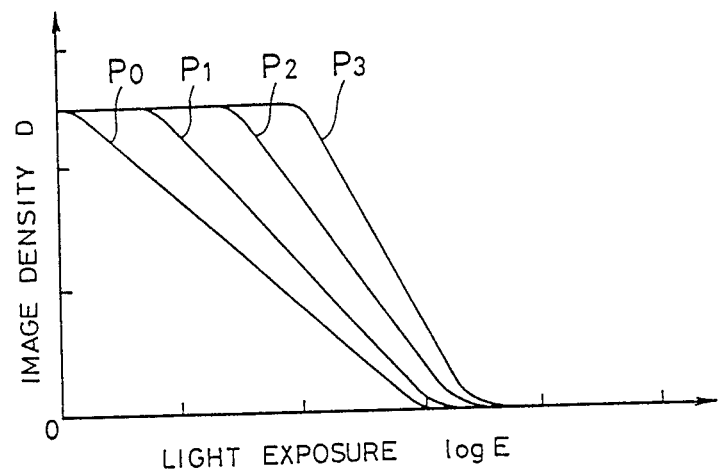
FIG. 2 is a graphical representation showing a relationship between an amount of light exposure of a photosensitive paper and a density of images developed on the paper with different developing pressures.
Figure 7:
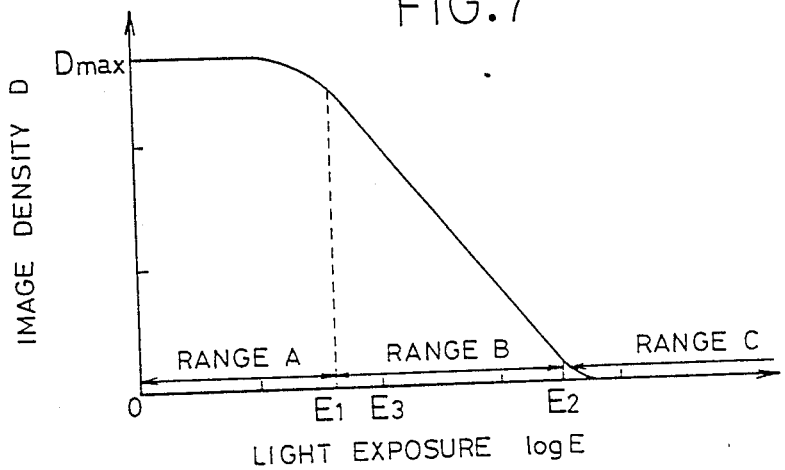
FIG. 7 is a graph showing an exposure-density relationship where a photosensitive paper using radiation-curable resin microcapsules is used.

The photosensitive paper 18 is used in the present system as a photosensitive recording medium. An example of this type of recording medium is disclosed, for example, in Laid-Open Publications 58-23024 and 58-23025 (laid open in 1983) of Japanese Patent Applications. More specifically, the photosensitive paper 18 consists of a substrate, a developer layer formed on the substrate, and a layer of microcapsules formed on the developer layer. Each microcapsule includes a photosensitive resin which is curable upon exposure to a radiation, and a colorless chromogenic material or color former which reacts with the developer layer to form a visible image. Upon exposure to a radiation, the photosensitive resin of the microcapsules in exposed areas of the photosensitive paper is polymerized and thus cured, while the photosensitive resin of the microcapsules in unexposed areas remains uncured. The cured microcapsules in the exposed areas are not ruptured in a developing process, that is, while the photosensitive paper 18 is fed through the nip of the developing pressure rollers 22. However, the insufficiently cured or partially cured microcapsules are ruptured to a varying degree depending upon the extent to which the microcapsules are exposed. As a result, the colorless chromogenic material is transferred to the developer layer and reacts with a developer material of the developer layer. Since the amount of the chromogenic material reacting with the developer material is commensurate with the amount or degree of light exposure of the microcapsules (and the degree of rupture), the density of the formed image is proportional to the amount of light exposure of the corresponding microcapsule. As illustrated in FIG. 7, the image density is maximum or almost saturated within an exposure range A whose upper limit E1 defines a basic minimum amount of light exposure of the photosensitive paper 18 to form a visible image. The density (log E) decreases as the light exposure increases within an intermediate range B defined by lower and upper limits E1 and E2. The image density is almost zero in a range C wherein the light exposure exceeds a certain limit, i.e., upper limit of the range B. Thus, the light exposure is varied within the range B, in order to produce images of a varying density. The range A is determined by the polymerization property of the radiation-curable resin which forms the base of each microcapsule, and by the preset nip pressure of the pressure rollers 22. Described in more detail, the microcapsule includes a photosensitive composition encapsulated in the radiation-curable resin. The photosensitive composition includes the previously indicated chromogenic material, and a photoinitiator. Upon exposure to a radiation, the photoinitiator is decomposed to free radicals, whereby the base resin is polymerized and solidified. However, in an initial stage of exposure, oxygen present in the microcapsule reacts with the free radicals, retarding the initiation of the polymerization of the base resin. Further, the density-exposure characteristics of the photosensitive paper 18 differs depending upon a developing pressure, as indicated in FIG. 2. The developing pressure for stable development of images is preferably held within a range between P1 and P2 (for example, about 20-30 kg/cm$^2$). In the figure, the developing pressures (nip pressures of the pressure rollers 22) Po, P1, P2 and P3 increase in the order of description.

Referring back to FIG. 1, a basic or first exposure device in the form of an illuminating lamp 26 is disposed in the first darkroom 14. A radiation emitted by this lamp 26 includes rays of light having a wavelength to which the photosensitive paper 18 is sensitive. While the photosensitive paper 18 is fed through the first darkroom 14, the paper 18 is exposed to such rays of light, to obtain a preliminary exposure equal to the basic minimum amount E1, i.e., the lower limit of the density-variable range B, as indicated in FIG. 7. The luminance capacity of the lamp 26 is so determined as to obtain this basic minimum exposure E1.

In the second darkroom 16, there is provided a monochrome image-forming or second exposure device which includes a cathode ray tube (CRT) 28 and a focusing device (optical system) 30. The CRT 28, which functions as a light source for forming latent images on the photosensitive paper 18, has a faceplate 32, a fluorescent screen 34 disposed inside the faceplate 32, and an electron gun 36 which emits an electron beam 38 toward the fluorescent screen 34. The CRT 28 is provided with a deflection coil 40 for sweeping or deflecting the electron beam 38 over a predetermined angular range, in a plane perpendicular to the direction of feed of the photosensitive paper 18. The intensity of the electron beam 38 is regulated by a suitable driver circuit (not shown), according to an IMAGE signal SG generated by an image-signal generator 44. The fluorescent screen 34 emits a line of light when swept by the corresponding electron beam 38 from the electron gun 36. The emitted line of light from the fluorescent screen 34, which represents a line of picture elements, is passed through an optical filter 42, whereby only the rays of light in a spectrum corresponding to a sensitive range of the photosensitive paper 18 is incident upon the focusing device 30, and is thus focused on the photosensitive paper 18. The photosensitive paper 18 is fed by the feed rollers 20 on the support 24, at a speed corresponding to a rate at which successive lines of light are emitted by the fluorescent screen 34. In this manner, latent images are formed on the photosensitive paper 18, by repetitive scanning of the image-signal light from the fluorescent screen 34, in the direction perpendicular to the feed direction of the paper 18. The thus image-wise exposed photosensitive paper 18 is passed through a pressure nip between the pressure rollers 22, whereby the latent images are developed into visible images.

As described above, the present embodiment is adapted such that the photosensitive paper 18 is subjected to a preliminary exposure in the first darkroom 14 by the basic exposure device (lamp 26), to obtain the basic minimum exposure E1, and is then subjected to an image-forming exposure in the second darkroom 16 by the image-forming exposure device 28, 30, whereby latent images are formed on the photosensitive paper 18.

Therefore, the amount of light that must be generated by the fluorescent screen 34 is only a difference between the total amount of light received by the photosensitive paper 18 for the formation of latent images, and the basic minimum amount E1 obtained during the preliminary exposure by the lamp 26. Consequently, the required intensity of the light emitted by the fluorescent screen 34 can be accordingly reduced. Thus, the instant image transfer system permits efficient formation of latent images on the photosensitive paper 18, with reduced deterioration and improved durability of the fluorescent screen 34.

Further, the instant arrangement permits a comparatively large relative variation in the level of the IMAGE signals SG which are applied to the CRT 28 to designate different densities of the corresponding images. In other words, the instant image transfer system permits a comparatively high ratio of one IMAGE signal level to another, with the lowest level corresponding to the basic minimum exposure E1 of FIG. 7, thus facilitating calibration of the image density.

Figure 3:
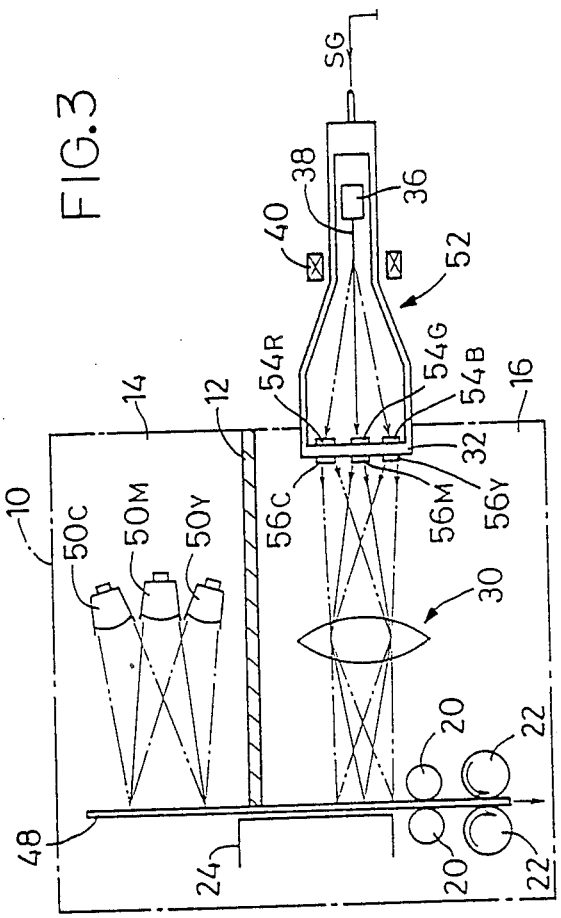
FIG. 3 is a schematic view corresponding to that of FIG. 1, illustrating another embodiment of the invention.
Figure 5:
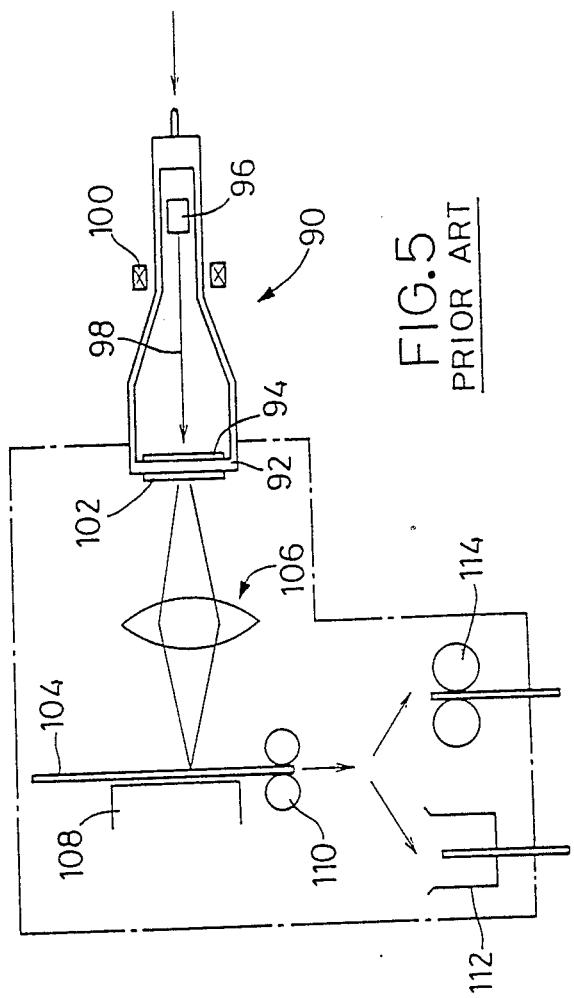
FIG. 5 is a schematic view showing a known image transfer system.
Figure 6:
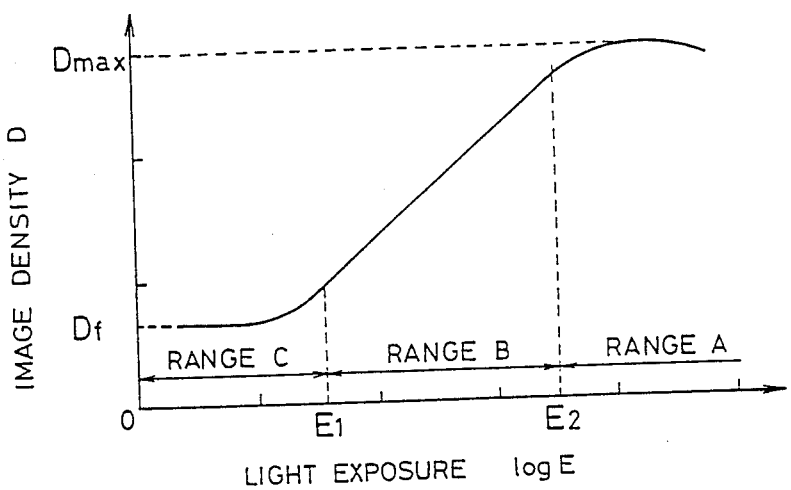
FIG. 6 is a graph showing an exposure-density relationship where a silver chloride photosensitive paper is used.

Referring next to FIG. 3, another embodiment of the invention will be described. In the interest of brevity and simplification, the same reference numerals as used in FIG. 1 are used in FIG. 3 to identify the functionally corresponding components.

Figure 4:
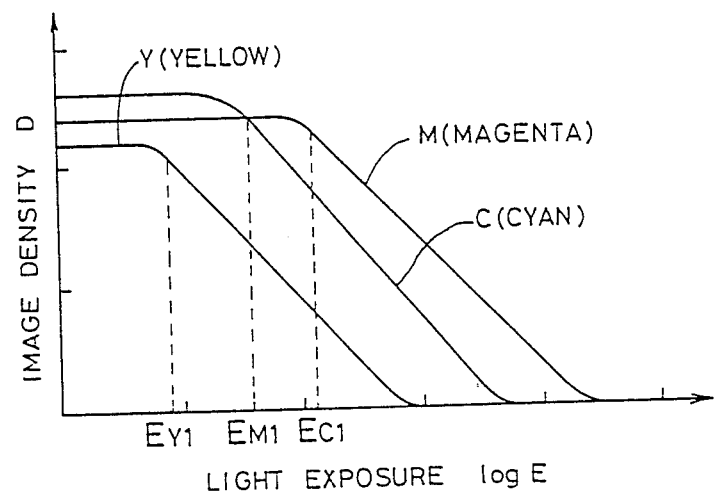
FIG. 4 is a graphical representation illustrating an exposure-density relationship in color image development, in the embodiment of FIG. 3.

This modified embodiment uses a photosensitive paper 48 capable of forming color images thereon. This photosensitive paper 48 has three types of microcapsules distributed in a mixed condition, for example, microcapsules C curable by a radiation having a wavelength $\lambda C$ of about 340nm, microcapsules M curable by a radiation having a wavelength $\lambda M$ of about 385nm, and microcapsules Y curable by a radiation having a wavelength $\lambda Y$ of about 470nm. Each of the microcapsules C contains a normally colorless chromogenic material which produces a cyan color. Similarly, the microcapsules M and Y contain normally colorless chromogenic materials which produce magenta and yellow colors, respectively. Accordingly, when the photosensitive paper 48 is locally exposed to the radiation having the wavelength $\lambda C$, only the microcapsules C in the exposed area are cured, and the microcapsules M and Y in that exposed area are ruptured to produce the magenta and yellow colors in the developing process, whereby a reddish color is produced. Similarly, the microcapsules M in an area of the photosensitive paper 48 exposed to the radiation having the wavelength $\lambda M$ are cured, and the microcapsules C and Y in that area are ruptured to produce the cyan and yellow colors in the developing process, whereby a greenish color is produced. Likewise, the microcapsules Y are cured, and the microcapsules C and M are ruptured to produce the cyan and magenta colors, eventually creating a blueish color, when these microcapsules are exposed to the radiation having the wavelength $\lambda Y$. FIG. 4 shows density-exposure relationships for the three types of microcapsules C, M and Y.

In the first darkroom 14, there are disposed three illuminating lamps 50C, 50M and 50Y. The lamp 50C emits a radiation of the wavelength $\lambda C$, and the luminance of this lamp 50C is determined so that the photosensitive paper 48 passing through the first darkroom 14 is exposed to the radiation by a basic minimum amount EC1 as indicated in FIG. 4. The lamp 50M emits a radiation of the wavelength $\lambda M$, and the luminance of this lamp 50M is determined so that the paper 48 is exposed to the radiation by a basic minimum amount EM1 as also indicated in FIG. 4, while the paper 48 is fed through the first darkroom 14. Similarly, the lamp 50Y emits a radiation of the wavelength $\lambda Y$, and the luminance of the lamp 50Y is determined so as to expose the paper 48 to the radiation by a basic minimum amount EY1 as indicated in FIG. 4, during passage of the paper 48 through the first darkroom 14.

While the three lamps 50C, 50M and 50Y are provided in the present embodiment, these lamps may be replaced by a single lamp which is adapted to emit radiations having the three different wavelengths $\lambda C$, $\lambda M$ and $\lambda Y$, so that the amounts of these three radiations are proportional to the basic minimum amounts EC1, EM1 and EY1 as indicated in FIG. 4. This arrangement eliminates adjustment of the radiation wavelength for each of the three lamps, and reduces the size and cost of the image transfer system.

In the second darkroom 16, there is provided a color-imaging CRT 52. On the inside surface of the faceplate 32 of this CRT 52, there are disposed three fluorescent elements 54R, 54G and 54B. The element 54R emits a line of light corresponding to red picture elements of an image, and the element 54G emits a line of light corresponding to green picture elements of the image. Similarly, the element 54B emits a line of light corresponding to blue picture elements of the image. These lines of light are produced when the respective fluorescent elements 54R, 54G and 54B are struck by electron beams 38 which are produced by the electron gun 36. More specifically, the electron gun 36 is driven by the IMAGE signals SG generated by the image-signal generator 44. The electron beams 38 are deflected by the deflection coil 40 over a predetermined angular range, and the intensity of the beams is adjusted by the driver circuit (not shown). Accordingly, successive lines of light representing red picture elements of the corresponding lines of images to be formed on the photosensitive paper 48 are produced by the fluorescent element 54R, according to the IMAGE signals SG from the image-signal generator 44. Similarly, successive lines of light representing green picture elements of the corresponding lines of images are produced from the fluorescent element 54G, while successive lines of light representing blue picture elements of the corresponding lines of images are produced from the fluorescent element 54B.

On the front surface of the faceplate 32, there are disposed three optical filters 56C, 56M and 56Y for converting the lights from the respective fluorescent elements 54R, 54G and 54B into corresponding radiations which have wavelengths $\lambda C$, $\lambda M$ and $\lambda Y$, respectively, to which the three types of the microcapsules C, M and Y are sensitive. These radiations are then focused on the photosensitive paper 48 by the optical focusing device 30. The photosensitive paper 48 are exposed to the radiations from the fluorescent elements 54R, 54G and 54B through the filters 54C, 54M and 54Y, while the paper 48 is fed on the support 24, at a speed corresponding to a rate at which the fluorescent elements are swept by the electron beams 38. Thus, latent images are formed on the photosensitive paper 48, and are developed into visible color images while the paper 48 is passed through the nip of the pressure rollers 22.

In the present embodiment, too, the photosensitive paper 48 is subjected to a preliminary exposure in the first darkroom 14 by the basic exposure lamps 50C, 50M and 50Y, by the basic minimum amounts EC1, EM1 and EY1 as indicated in FIG. 4. Subsequently, the photosensitive paper 48 is subjected to an image-forming exposure in the second darkroom 16, by the image-forming exposure device 52, 30, whereby the latent images are formed. Therefore, the required luminance of each fluorescent element 54R, 54G and 54B of the CRT 52 is equal to the total amount of exposure of the photosensitive paper 48, less the basic minimum amount EC1, EM1, EY1 provided by the respective basic exposure lamps 50C, 50M and 50Y. Accordingly, the image transfer may be efficiently achieved with comparatively reduced levels of luminace of the fluorescent elements 54R, 54G and 54B. This results in reduced deterioration and improved life expectancy of the elements 54R, 54G and 54B.

Further, since the microcapsules C, M and Y are subjected to preliminary exposures by the different basic minimum amounts EC1, EM1 and EY1, there is no need of adjusting the levels of the IMAGE signals SG for the cyan, magenta and yellow colors, for compensating for the differences in the basic minimum exposure amounts. That is, the amounts of image-forming exposures by the image-forming exposure device 52, 30 are varied within substantially the same ranges, to obtain the same density-exposure relationships for the three types of microcapsules C, M and Y.

Although the photosensitive paper 18, 48 of the type using radiation-curable microcapsules are used in the above-illustrated embodiments of FIGS. 1 and 3, other types of photosensitive paper such as a silver chloride coated paper may be used as a photosensitive recording medium.

In the above embodiments, the luminance of the basic exposure lamp 26, for example, is determined so as to give the basic minimum exposure E1 to the photosensitive paper 18, a preliminary exposure amount given by the basic exposure device may be smaller than the basic minimum amount E1 which is the lower limit of a range (indicated at B in FIG. 7) in which the density of images is varied according to the amount of the image-forming exposure by the image-forming exposure device 28, 30.

Further, the lower limit of the density-variable range B may be selected at E3 as indicated in FIG. 7, rather than the basic minimum level E1. In this case, the image-forming exposure amount is varied over a range between E3 and E2, and the preliminary exposure given by the basic exposure device (26; 50C, 50M and 50B) is increased to the level of E3.

The image-forming light source may consist of a light source, and a shutter which is opened and closed according to suitable image signals. The image-forming exposure device may be adapted such that its light source is moved relative to the photosensitive paper.

Figure 8:
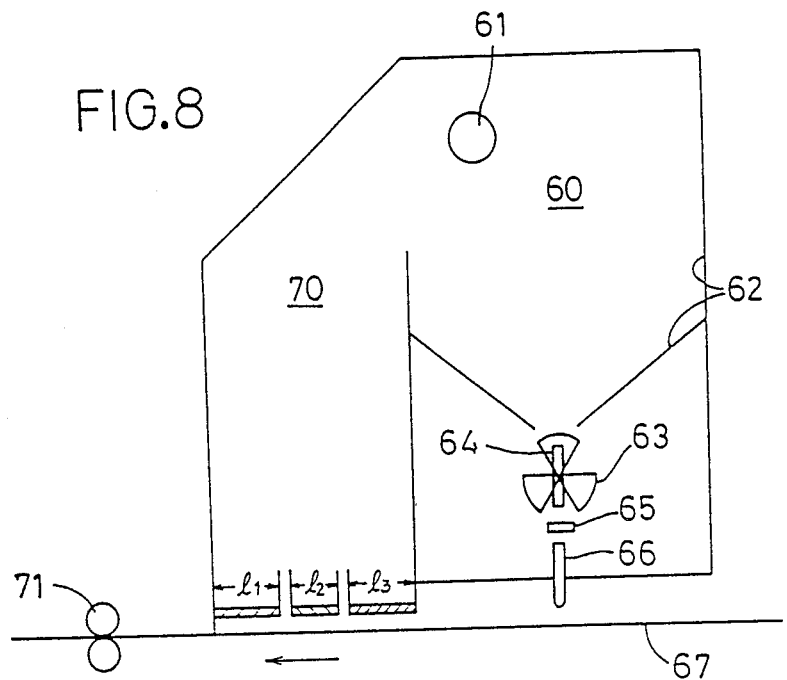
FIG. 8 is a schematic view of a further embodiment of the present invention.

Referring further to FIG. 8, there is shown a further embodiment of the invention, wherein an image transfer system has an image-forming exposure section 60 (indicated on the right-hand side of the figure), and a basic exposure section 70 (indicated on the left-hand side). The image transfer system further has a light source 61 in the form of a bar (such as a fluorescent lamp or FOT) above the image-forming and basic exposure sections 60, 70. The image-forming section 60 includes reflectors 62, a rotary filter device 63, a waveguide 64, an optical switch array 65 disposed parallel to the bar-like light source 61, and a selfoc lens array 66 (graded index type lens) also disposed parallel to the bar-like light source 61. Radiation emitted by the light source 61 is directed to the rotary filter device 63 through the reflectors 62 and other optical elements, and is guided through the waveguide 64 so that the radiation is incident upon the optical switch array 65 and the selfoc lens array 66. The radiation is then incident upon a color-imaging photosensitive paper 67 similar to the photosensitive paper 48 (which has been described in connection with the preceding embodiment). The radiation emitted with a suitable intensity by the light source 61 includes wavelengths corresponding to the three primary colors of light, red, green and blue. These wavelengths are selected by filter elements of the rotary filter device 63 which is rotatable around the waveguide 64. The selected rays of light passing through the respective filter elements are incident upon the optical switch array 65 which consists of a multiplicity of optical switches corresponding to picture elements or dots. The optical switches are selectively activated on to pass the light, according to suitable image signals, so that latent images corresponding to the activated optical switches are formed on the photosensitive paper 67.

Figure 9:
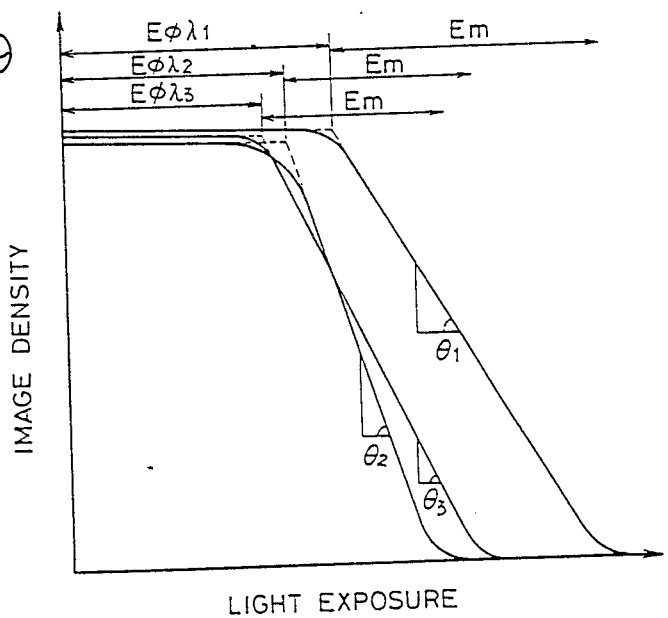
FIG. 9 is a graph showing exposure-density relationships of a color-imaging photosensitive paper, for three different radiations.
Figure 10:
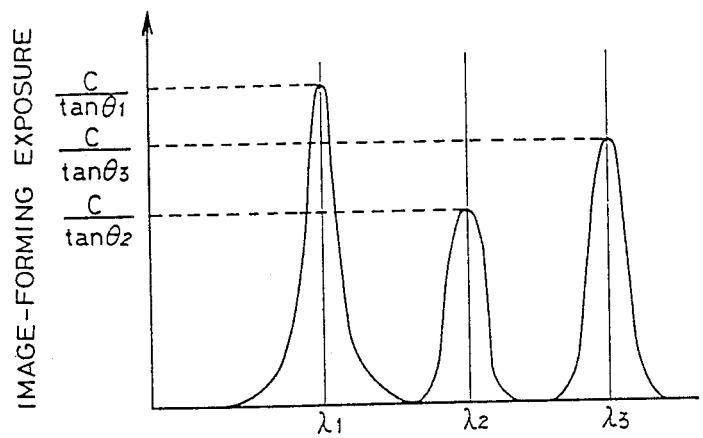
FIG. 10 is an illustration indicating required image-forming exposure amounts for different wavelengths.

FIG. 9 shows density-exposure relationships of the photosensitive paper 67. Basic minimum amounts of exposure of the paper 67 to the radiation wavelengths $\lambda 1$, $\lambda 2$ and $\lambda 3$ to form images are indicated at $E\phi\lambda 1$, $E\phi\lambda 2$ and $E\phi\lambda 3$, which correspond to EC1, EM1 and EY1 of FIG. 4. These basic exposures are given in the basic exposure section 70. Image-forming exposure amounts given in the image-forming exposure section 60 are indicated at Em in FIG. 9. In the present embodiment, the basic exposure of the photosensitive paper 67 for each wavelength is effected after the corresponding image-forming exposure. This basic exposure facilitates the image-forming exposure as already discussed in connection with the preceding embodiments.

The rotary filter device 63 in the image-forming section 60 is adapted such that the image-forming exposure amounts for the wavelengths $\lambda 1$, $\lambda 2$, and $\lambda 3$ are proportional to $C/\tan\theta 1$, $C/\tan\theta 2$ and $C/\tan\theta 3$, respectively, where C represents a constant. As shown in FIG. 8, the basic exposure section 70 has three basic exposure filters l1, l2 and l3, whose effective filter areas are determined in proportion to the basic minimum exposure amounts $E\phi\lambda 1$, $E\phi\lambda 2$ and $E\phi\lambda 3$, respectively. These filter arrangements of the image-forming and basic exposure sections 60, 70 allow balanced suitable exposures of the photosensitive paper 67 to the different wavelengths, even though the intensity of the radiation emitted by the light source 61 is the same for each wavelength, i.e., even though a single light source 61 is used.

Figure 11:
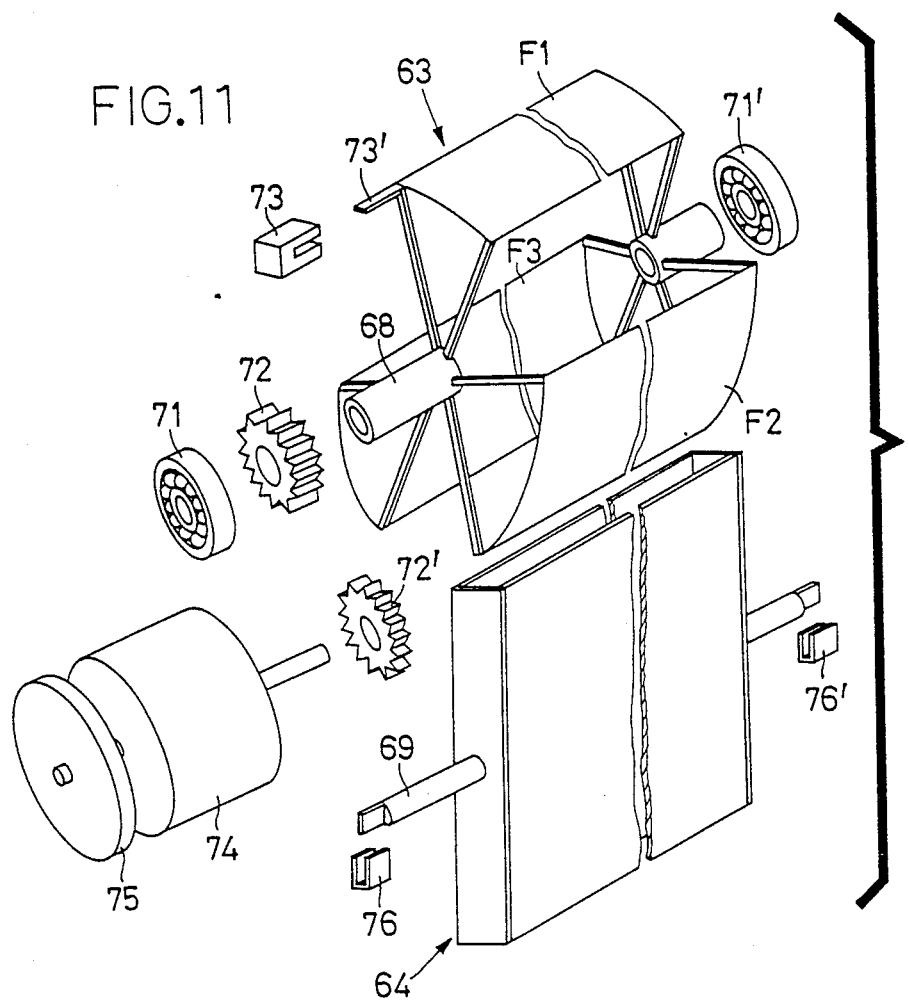
FIG. 11 is an exploded perspective view showing in detail a rotary filter device of an image-forming exposure device of the embodiment of FIG. 8.

Referring next to FIG. 11, the construction of the image-forming device in the section 60 will be described in detail. While the waveguide 64 is shown below the rotary filter device 63 in the figure, the waveguide 64 is disposed in the filter device 63 (as indicated in FIG. 8) such that the filter device 63 is rotatable around the waveguide 64.

The rotary filter device 63 is rotatably supported by bearings 71, 71', and is rotated by a motor 74 via gears 72, 72', about its hollow shaft 68. The waveguide 64 has a shaft 69 which extends through the hollow shaft 68 of the rotary filter device 63. The shaft 69 is fixed by fixing members 76, 76' outside the filter device 63.

Figure 12:
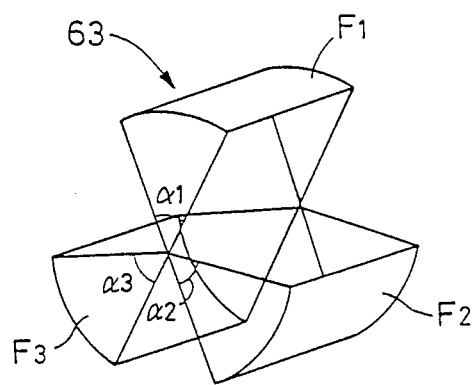
FIG. 12 is a perspective view indicating center angles of the rotary filter device which correspond to surface areas of three filter elements.

The rotary filter device 63 has three filter elements F1, F2 and F3 corresponding to the three primary colors of light. The filter elements F1, F2 and F3 are spaced apart from each other in a rotating direction of the rotary filter device 63, as illustrated in FIG. 12. Suitable spaces are provided between the adjacent filter elements F1, F2, F3. The surface areas of the filter elements F1, F2 and F3, and center angles α1, α2 and α3 (FIG. 12) defining the arcs of the filter elements, are determined in proportion to C/tan θ1, C/tan θ2 and C/tan θ3 as previously suggested. This arrangement permits intended image-forming exposures of the photosensitive paper 67 to the wavelengths corresponding to the three primary colors of light, while compensating for a difference in the sensitivity of the photosensitive paper 67 to those different wavelengths, and/or a fluctuation of the light source 61 in its intensity for each radiation wavelength. The rays of light which have passed through the filter elements F1, F2 and F3 are incident upon the optical switch array 65 (FIG. 8) which is opened in synchronization with the passage of the light through the filter device 63. The waveguide 64 may be replaced by optical fibers, selfoc lens or other alternatives. In the present rotary filter device 63, the filter elements F1, F2 and F3 are arcuate in shape. However, these elements may consist of an arcuate portion and a flat portion. In this case, too, the filter elements are adapted to receive a line of light produced by the bar-like light source 61. While the rotary filter device 63 has a generally hexagonal shape defined by the three filter elements F1, F2 and F3 and the adjacent three spaces, the device 63 may have other polygonal shapes having N sides (N: integer), so that one of the three filter elements F1, F2 and F3 is selectively brought into alignment with the inlet of the waveguide 64, during rotation of the device 63. In either case, the filter elements F1, F2 and F3 need not be separated from each other by adjacent spaces, provided each filter element and the corresponding space can be aligned with the upper and lower ends of the waveguide 64. It is preferred that the filter elements F1, F2 and F3 are separated from each other by suitable transparent members whose weights are adjusted to establish a balance of the rotary filter device 63 as a whole.

The operation of the rotary filter device 63 is controlled by an electronic control circuit which incorporates an index switch 73, 73', and a rotation sensor 75 for sensing the rotating speed of the drive motor 74. This aspect will be described refering to FIG. 13. The image-forming exposure amounts of the photosensitive paper 67 can be adjusted by regulating the speeds at which the filter elements F1, F2 and F3 are moved along the circular path of the device 63. It is considered possible to control the amounts of light passing through the filter elements, by adjusting the thickness and density of the individual filter elements, in addition to the surface area and speed of the filter elements. The same adjustments may apply to the basic exposure filters 11, 12 and 13.

According to the present embodiment, a variation of the light source 61 in the intensity of the different radiation wavelengths, and a difference of sensitivity of the photosensitive paper 67 to the different wavelengths, can be compensated for by adjusting the surface areas of the filter elements F1, F2 and F3, and the center angle α1, α2 and α3 formed around the shaft 68. Thus, the developed photosensitive paper 67 can be given a desired color balance. Further, the relatively simple rotary filter device 63 makes it possible to easily produce a desired color balance adjustment, even with the bar-like light source 61.

The light source 61 may be adapted such that the intensity of light of each wavelength (corresponding to each of the three primary colors of light) is adjusted, while a still remaining difference is compensated for by the adjustments of the filter, elements F1, F2 and F3. Alternatively, the adjustment of the center angles α1, α2 and α3 of the filter device 63 is achieved as a primary compensation, and the thickness and other parameters of the filter elements F1, F2 and F3 are adjusted as an auxiliary compensation.

Figure 13:
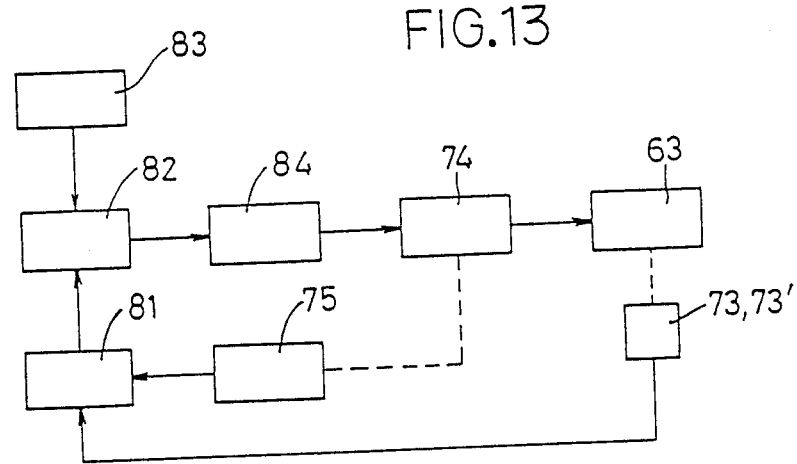
FIG. 13 is a block diagram of a driver circuit for controlling a motor for activating the rotary filter device.

In the case where the adjustment of the image-forming exposure amount for each wavelength is effected by controlling the time in which the filter elements F1, F2 and F3 pass the inlet of the waveguide 64, the position and speed of the filter elements are detected by the index switch 73, 73' and the rotation sensor 75. As illustrated in FIG. 13, the position and speed signals from the index switch 73, 73' and the rotation sensor 75 are received by a position/speed detector circuit 81. In the meantime, speed data indicative of the speed of each filter element is generated from a speed data circuit 83. The outputs of the position/speed circuit 81 and the speed data circuit 83 are applied to an arithmetic circuit 82, whose output is applied to a driver circuit 84 to activate the motor 74, so that each filter element F1, F2 and F3 is moved at a speed represented by the speed data from the speed data circuit 83.

Figure 14:
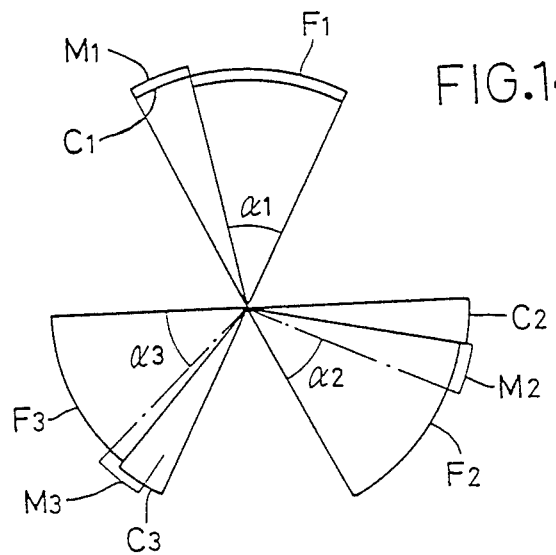
FIG. 14 is a view showing a rotary filter device equipped with stationary and movable shields.

A modified form of the rotary filter device is depicted in FIG. 14, wherein elongate substantially rectangular stationary shields C1, C2 and C3 are fixedly disposed at the leading end of the respective filter elements F1, F2 and F3 (as seen in the rotating direction of the filter device). The shields C1, C2 and C3 extend parallel to the axis of the filter device, so as to overlap the corresponding leading portions of the filter elements F1, F2 and F3. Further, substantially rectangular movable shields M1, M2 and M3 are disposed radially outwardly of the stationary shields C1, C2 and C3, such that these movable shields are movable along the arcs of the filter elements F1, F2 and F3, in the direction of rotation of the filter device 63. The movable shields M1, M2 and M3 can be fixed at desired positions on the filter elements. In this arrangement, the effective surface areas of the filter elements F1, F2 and F3 can be suitably adjusted by positioning the movable shields M1, M2 and M3 relative to the filter elements, so that the suitable portions of the filter elements are covered by the movable shields. Further, the present arrangement permits compensation for a variation in the ON-OFF times of the optical switch array 65, and is effective to improving the control accuracy of the image-forming exposures. The stationary and movable shields C1, C2, C3, M1, M2 and M3 may be disposed near the trailing end of the filter elements F1, F2 and F3. Alternatively, it is possible that one of the stationary and movable shields on each filter element is disposed near the leading end, while the other shield is disposed near the trailing end. Further, these shields may be disposed on the inner surfaces of the filter elements.

The stationary shields C1, C2 and C3 need not be flat, and may be filter sheets whose leading portions extend from respective rolls to cover portions of the filter elements. In this case, the filter sheets may be used as movable shields, by adjusting the length of extension from the rolls.

The rotary filter device 63 need not be rotated in one predetermined direction. Further, the rotary filter may be replaced by a pivotal filter which is pivoted bidirectionally. In any case, the filter device must have a plurality of filter elements which are moved as a unit.

Figure 15:
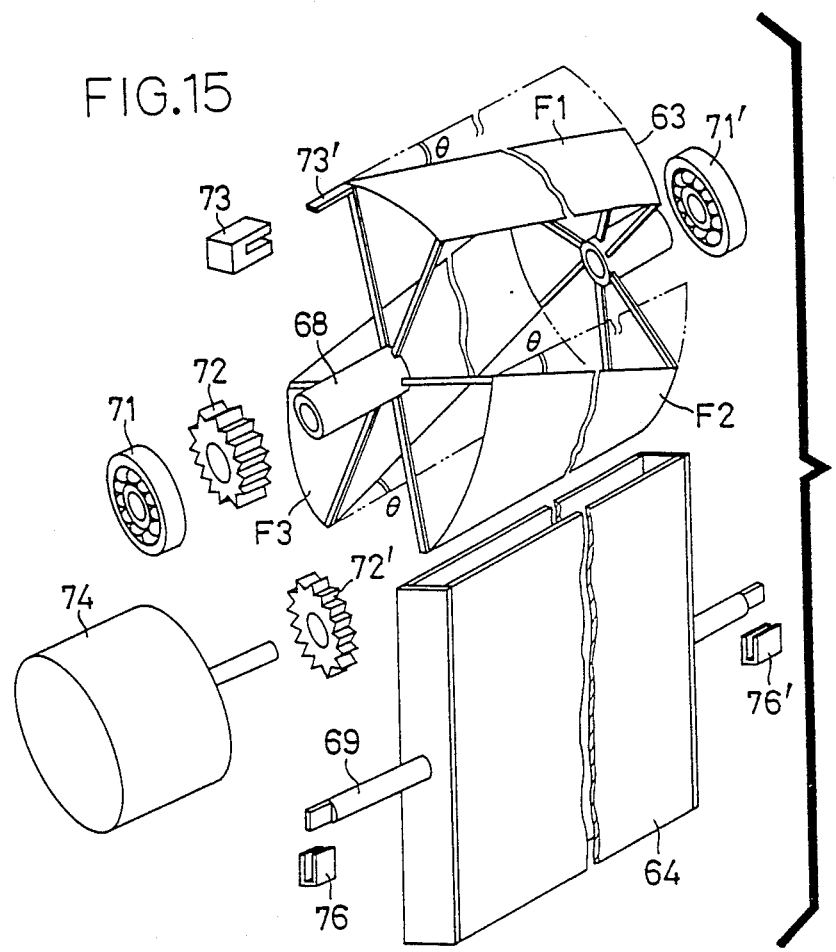
FIG. 15 is an exploded perspective view of a modified rotary filter adapted for increased rotating speed.

The optical switches of the optical switch array 65 extending along the bar-like light source 61 are difficult to be activated at one time. Usually, therefore, the optical switches or groups of the optical switches are sequentially activated, from one end of the array 65 toward the other end. Consequently, the completion of activation of all optical switches requires a given time corresponding to a given angle of rotation of the rotary filter device 63. This does not cause a problem where the rotating speed of the filter device 63 is low. But, where the filter device 63 is rotated at a relatively high speed, the activation of some of the optical switches is delayed with respect to the passage of the filter elements past the operative position. This problem may be overcome, for example, by modifying the filter device 63 as indicated in FIG. 15. In this modified arrangement, the generally rectangular filter elements F1, F2 and F3 of FIG. 11 are offset at their one end in the rotating direction of the filter device 63, with respect to their other end, such that the longer sides of the rectangle form a suitable angle $\theta$ to a straight line parallel to the axis of the filter device, as indicated in FIG. 15. In the other aspects, the modified rotary filter device of FIG. 15 are identical with that of FIG. 11.

Like the first and second darkrooms of the embodiments of FIGS. 1 and 3, the image-forming exposure section 60 and the basic exposure section 70 of the embodiment of FIG. 8 are separated from each other by a suitable partiton wall.

Further embodiments of the present invention will be described by reference to FIGS. 16 through 32. In these embodiments, desired source image information to be reproduced is provided on an original, and a photosensitive paper is exposed to a radiation which is transmitted through or reflected by the original.

Referring to FIG. 16, a surface of an original 124 is irradiated with radiation which is generated by an illuminating lamp 120 and transmitted through a condenser lens 122. The original 124 is a transparent slide which is slidably movable by a positioning device 128 between a first, inoperative position of FIG. 18 and a second, operative position of FIG. 16. The second position is located between the condenser lens 122 and a focusing lens 126. The focusing lens 126 receives the radiation transmitted through the original 124, and focuses the received radiation on a photosensitive paper 130. Since the radiation from the original 124 represents an image on the original 124, a latent image corresponding to the original image is formed on the thus image-wise exposed photosensitive paper 130.

The image-wise exposed photosensitive paper 130 and a developer sheet 132 are superposed on each other, and the superposed paper 130 and sheet 132 are passed through the nip of a pair of presser rollers 134. The developer sheet 132 has a layer of a developing material which is capable of chemically reacting with a normally colorless chromogenic material (color precursor) contained in microcapsules on the photosensitive paper 130, thereby producing a color. With the microcapsules selectively ruptured by the presser rollers 134, the chromogenic material flows out of the ruptured microcapsules and reacts with the developing material on the developer sheet 132, whereby the latent image formed on the paper 130 by image-wise exposure thereof is developed into a visible image identical with the image on the original 124.

As described above with respect to the first embodiment of FIG. 1, the photosensitive paper 130 has a layer of the microcapsules each of which contains a photosensitive resin and photoinitiator as well as the chromogenic material, as disclosed in Laid-Open Publications 58-23025 and 58-88739 of Japanese Patent Applications. The photosensitive paper 130 has a photosensitive characteristic as indicated in FIG. 17. Described more specifically, the density of a visible image produced on the exposed and developed photosensitive paper 130 remains constant until the amount of exposure of the paper 130 exceeds a threshold level E1. The image density progressively decreases with an increase in the exposure amount between the threshold level E1, and a saturated level E2 at which the microcapsules are completely cured and the image density is at a minimum level. Above the exposure amount E1, the image density on the photosensitive paper 130 varies with the density of the image on the original 124, in proportion to the exposure amount.

Figure 18:
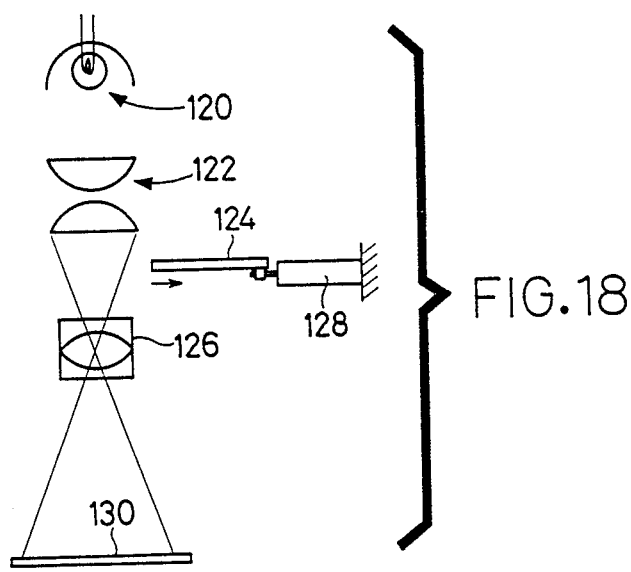

In a first exposing operation or a pre-exposing operation, the entire surface of the photosensitive paper 130 is pre-exposed to the radiation from the lamp 120, with the original 124 placed in its first or inoperative position, as shown in FIG. 18. The exposure amount is regulated to be substantially equal to the threshold level E1 as indicated in FIG. 17, by a controller (not shown) which is adapted to adjust the exposure time. Then, the original 124 is moved to its second or operative position of FIG. 16 between the condenser and focusing lenses 122, 126, and a second or image-forming exposing operation is effected such that the radiation transmitted through the original 124 is incident upon the photosensitive paper 130, whereby a latent image corresponding to the original image is formed on the paper 130. In this second exposing operation, the exposure time is selected so that the exposure amount varies between the values E1 and E2 indicated in FIG. 17, according to the density distribution or gradient of the original image. The microcapsules on the the photosensitive paper 130 subjected to the first and second exposing operations are cured in different degrees according to the exposure amount in the second exposing step, that is, according to the density distribution of the original image. When the thus image-wise exposed photosensitive paper 130 and the developer sheet 132 are passed through the nip of the presser rollers 134, the chromogenic materials flow out of the microcapsules and chemically react with the developing material on the developer sheet 132. The amount of the chromogenic material which reacts with the developing material varies with the degree in which the appropriate microcapsule is cured due to exposure to the radiation. In this manner, the latent image is developed into a visible image on the photosensitive paper 130. Namely, the original image on the original 124 is reproduced on the photosensitive paper 130 such that the density distribution or gradient of the reproduced image on the paper 130 is identical with that of the original image on the original 124. In other words, an area on the photosensitive paper 130 which corresponds to a relatively dark or thick-colored area on the original 124 is exposed by a relatively small amount, while an area of the paper 130 corresponding to a relatively light or thin-colored area on the original 124 is exposed by a relatively large amount. Accordingly, if the photosensitive paper 130 is a monochrome imaging paper, a reproduced image is given a density distribution or gradient from black to white. Further, the average density of the reproduced image is substantially proportional to the exposure amount in the second or image-forming exposing step. In the present embodiment, the first exposing operation to pre-expose the photosensitive paper 130 by the first amount E1 precedes the second image-forming exposing operation by the second amount E1−E2. However, the first exposing operation may follow the second exposing operation. While it is desired that the first exposure amount given in the first exposing operation is substantially equal to the threshold amount E1, the first exposure amount may be a value which is more or less than the threshold value E1, provided the first exposure amount is near the threshold value.

Figure 19:
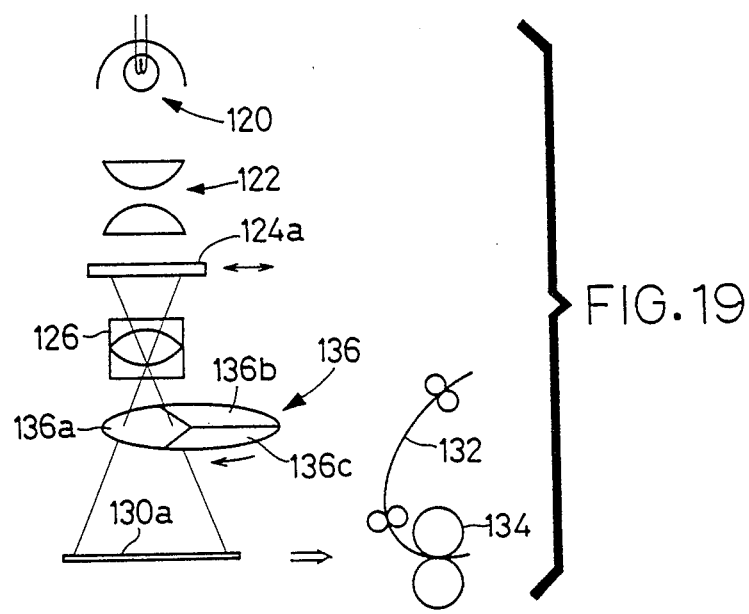
FIG. 19 is a view showing a yet further embodiment of the invention adapted to record a full-color image.
Figure 20A:
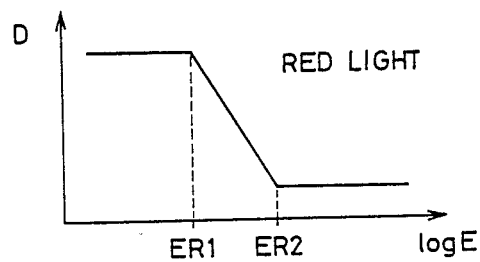
FIGS. 20(a), 20(c) are graphs illustrating photosensitive characteristics of three different types of microcapsules of a color-imaging photosensitive paper used in the image transfer system of FIG. 19.
Figure 20B:
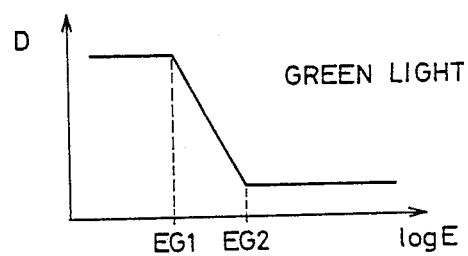
Figure 20C:
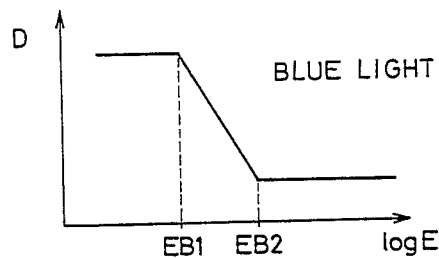

Referring next to FIG. 19, a color-imaging operation using an original will be described. In the figure, a photosensitive paper 130a has a microcapsule layer consisting of three different types of microcapsules which contain different chromogenic materials corresponding to cyan, magenta and yellow, as well as radiation-curable resin and photoinitiator. These three different types of microcapsules are evenly distributed over the microcapsule layer. In the first exposing step in this embodiment, the photosensitive paper 130a is pre-exposed by the radiation from the lamp 120, with a color original 124a placed in the first or inoperative position, in the same manner as indicated in FIG. 18. More specifically, the cyan, magenta and yellow microcapsules are pre-exposed by the radiation via respective filter elements 136a, 136b, 136c of a color separation filter 136, so that the pre-exposure amounts for the cyan, magenta and yellow microcapsules are equal to threshold levels ER1, EG1 and EB1 as indicated in FIGS. 20(a), 20(b) and 20(c), from which the image density starts to vary. The pre-exposure times for the three types of microcapsules are determined so that the threshold values ER1, EG1 and EB1 are obtained. Then, the color original 124a is moved to its second position as indicated in FIG. 19, and the photosensitive paper 130a is image-wise exposed via the original 124a and each of the filter elements 136a, 136b and 136c (red, green and blue filters) of the color separation filter 136, whereby a latent image is formed on the paper 130a. The image-forming exposure times in this second exposing operation for the cyan, magenta and yellow microcapsules through the respective filter elements 136a, 136b and 136c are adjusted, in view of the photosensitive characteristics of the cyan, magenta and yellow microcapsules, as indicated in FIGS. 20(a), 20(b) and 20(c), so that the reproduced color image on the photosensitive paper 130a is given a density gradient corresponding to that of the original image In this embodiment, too, the first exposing operation may follow the second exposing operation. While images are reproduced on the photosensitive paper 130 or 130a in the embodiments of FIGS. 16–19, it is possible that images are transferred to the developer sheet 132 when the superposed photosensitive paper and developer sheet are passed through the nip of the presser rollers 134. In this case, the developer sheet 132 is used as a recording medium.

There will be described another embodiment which uses a color-imaging photosensitive paper 152 and a developer sheet 148, as disclosed in U.S. Pat. No. 4,399,209. When other types of photosensitive paper and developer sheet are used, some modifications associated with the fixing of reproduced images are required, but the photosensitive paper may be exposed by an exposing device 142 used in the present embodiment.

Figure 21:
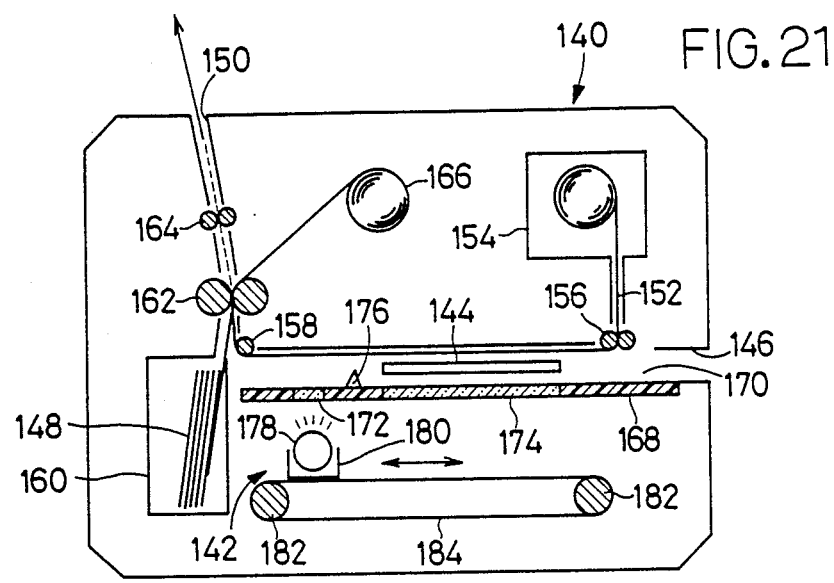
FIGS. 21 and 22 are views showing another embodiment of the invention, FIG. 21 indicating an exposing operation through a first light-transparent portion of an original support plate, and FIG. 22 indicating an exposing operation through a second light-transparent portion of the original support plate.

Referring to FIG. 21, the present embodiment is shown as an image transfer system 140 having a housing of a box-like construction. In a lower part of the housing of the image transfer system 140, there is disposed the above-indicated exposing device 142. The system further includes: an inlet 146 open in the right-hand side wall of the housing, for introducing an original 144; an outlet 150 open in the top wall of the housing, through which a developer sheet 148 bearing a reproduced image is delivered; a roll cassette 154 which accommodates a roll of a photosensitive paper web 152 in a light-shielding manner; drive rolls 156 and a guide roll 158 for feeding the photosensitive paper web 152 from the roll cassette 154 and guiding the web 152 along a feed path; a sheet storage 160 which accommodates a stack of the developer sheets 148; pressing rollers 162 for pressing the superposed photosensitive paper web 152 and developer sheet 148, and thereby developing a latent image on the paper web 152 into a visible image on the developer sheet 148 and fixing the visible image; feed rolls 164 for feeding the developer sheet 148 from the nip of the presser rollers 162 toward the outlet 150; and a take-up roll 166 for winding the used portion of the photosensitive paper web 152 from the presser rollers 162.

In the housing of the instant image transfer system 140, there are further disposed a support plate 168 which partially defines a passage 170 communicating with the inlet 146. The support plate 168, on which the original 144 is placed, consists of an opaque plate which is provided with a first light-transparent portion 172 and a second light-transparent portion 174. The first light-transparent portion 172 permits a radiation to pass therethrough directly toward the photosensitive paper web 152, for effecting a basic or first exposing operation to give the paper web 152 a basic minimum amount of exposure. The second light-transparent portion 174 permits a radiation to pass therethrough so that the radiation is incident upon the paper web 152 through the original 144 placed on the support plate 168, for effecting an image-forming or second exposing operation.

The original 144 inserted into the passage 170 through the inlet 146 is slidably fed on the support plate 168, while being pressed against the plate 168 by the paper web 152 which is fed by the drive rolls 156. The original 144 is positioned in alignment with the second light-transparent portion 174, due to abutting contact with a stop 176 provided on the support plate 168. Under the support plate 168, there is disposed a light source unit 180 incorporating an illuminating lamp 178. The light source unit 180 is movable in a direction parallel to the support plate 168. More specifically, the light source unit 180 is fixed on a wire belt 184 which is rotated on a pair of pulleys 182, one of which is driven by a stepper motor (not shown).

Figure 22:
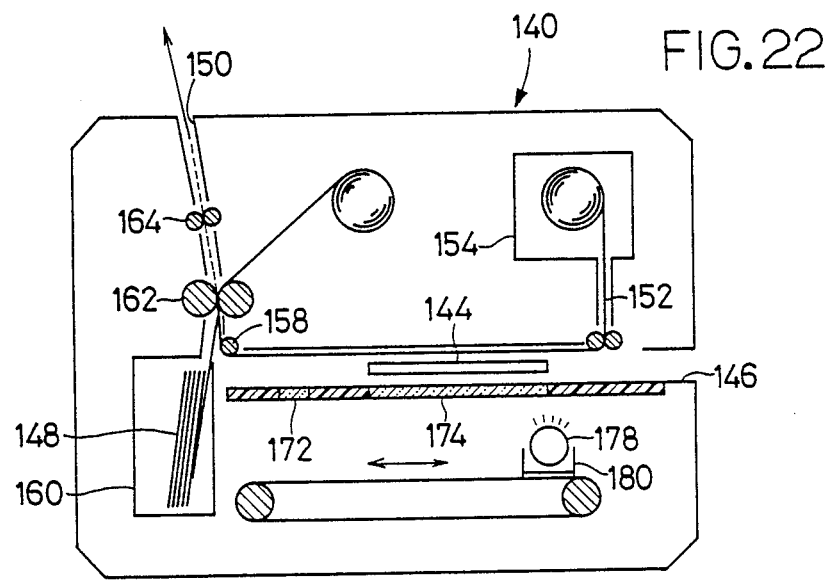

The image transfer system 140 constructed as described above is operated in the following manner:

Initially, the original 144 is inserted through the inlet 146 and positioned in the second light-transparent portion 174 of the support plate 168. Then, the portion of the photosensitive paper web 152 corresponding to the original 144 is held in pressed contact with the original 144 on the support plate 168, by a suitable presser device (not shown). In this condition, the illuminating lamp 178 is moved from its initial position of FIG. 21 right below the first light-transparent portion 172, toward its stroke end position adjacent to the inlet 146 (right-hand side end of the wire belt 184, as seen in FIG. 21). FIG. 22 shows the light source unit 180 located at the right-hand side stroke end adjacent to the inlet 146. The lamp 178 is turned on before it reaches the second light-transparent portion 174. During the movement of the lamp 178, the photosensitive paper web 152 is image-wise exposed to a radiation which is generated by the lamp 178 and which is transmitted through the second light-transparent portion 174 and the original 144. Thus, the microcapsules on the paper web 152 are selectively cured, whereby a latent image corresponding to the image on the original 144 is formed on the paper web 152. In this manner, the second or image-forming exposure is effected. When the light source unit 180 reaches the right-hand side stroke end as indicated in FIG. 22, the stepping motor for rotating the wire belt 184 is operated in the reverse direction, to return the unit 180 to the initial position of FIG. 21. If a further amount of image-forming exposure of the paper web 152 is required in this second exposing operation, the lamp 178 remains on during the return movement of the light source unit 180. It is also possible that the light source unit 180 is reciprocated two or more times as needed, with the lamp 178 kept on. After the required image-forming or second exposing operation is completed, the light source unit 180 is located at the initial position of FIG. 21.

After the latent image is formed on the photosensitive paper web 152, the image-wise exposed portion of the web 152 is further exposed to the radiation from the lamp 178, through the first light-transparent portion 172 of the support plate 168, but not through the original 144. This post-exposure corresponds to the pre-exposure as described with the preceding embodiments, and is interpreted to mean the first exposing operation which follows the second, image-forming exposing operation. The paper web 152 subjected to the post-exposure step (first exposing operation) is then released from a pressure by the pressing device, and is wound on the take-up roll 166. Before the exposed portion of the paper web 152 reaches the take-up roll 166, the developer sheet 148 is superposed on the exposed portion of the web 152, and the superposed portion of the web 152 and developer sheet 148 are pressed by the presser rollers 162, whereby the uncured microcapsules on the web 152 are ruptured to permit the chromogenic material to chemically react with the developing material on the developer sheet 148. As a result, a colored visible image is formed on the developer sheet 148.

Figure 23:
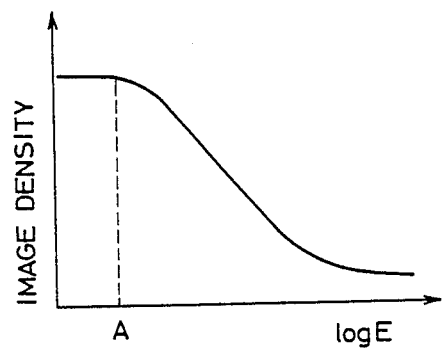
FIG. 23 is a view showing a photosensitive characteristic of a photosensitive paper used in the embodiment of FIGS. 21 and 22.

In the above-described image transfer system 140, an image is reproduced with an excellent density gradient characteristic. Described more particularly, the photosensitive paper 152 has a relationship between the amount of exposure E thereof and the density of an image reproduced, as indicated in FIG. 23. Namely, the image density remains constant until the exposure amount E reaches a basic minimum amount A. The first exposing operation through the first light-transparent portion 172 of the support plate 168 is effected to obtain an exposure amount substantially equal to this basic minimum exposure amount A. Since the amount of exposure in the second or image-forming exposing operation through the original 144 (through the second light-transparent portion 174) is added to the basic minimum amount A (given after the image-forming exposing operation in the present embodiment), the latent image formed on the photosensitive paper 152 faithfully reflects the density gradient or distribution on the original image, whereby a visible image obtained from the latent image has a density distribution similar to that of the original image.

It is possible that the support plate 168 shown in FIGS. 21 and 22 is provided with a third light-transparent portion (not shown) located to the right of the second light-transparent portion 174. In this case, the pre-exposing operation can be effected while the original 144 is moved through the passage 170 with the photosensitive paper web 152, to the position aligned with the second light-transparent portion 174, if the lamp 178 is located right below the third light-transparent portion during the movement of the original and the web. This arrangement minimizes the required exposure time for image-wise exposing the paper web 152.

Also, the original 144 may be moved in the direction perpendicular to the feeding direction of the paper web 152, when the original 144 is positioned on the second light-transparent portion 174 of the support plate 168. In this case, too, the paper web 152 may be pressed against the original 144 on the second light-transparent portion 174, and the support plate 168 may be provided with a third light-transparent portion as indicated above, for effecting a pre-exposing operation during movement of the original 144 to the position on the second light-transparent portion 174. Such a pre-exposing light-transparent portion may be provided, in place of the first light-transparent portion 172 which is adapted to post-expose the paper web 152.

The embodiment of FIG. 21 may be provided with a mirror or other optical element located below the first light-transparent portion 172, for reflecting the radiation from the lamp 178 so that the reflected radiation travels through the first light-transparent portion 172. In this case, it is not necessary to position the lamp 148 right below the first light-transparent portion 172, when the first exposing or post-exposing operation is effected.

Figure 24:
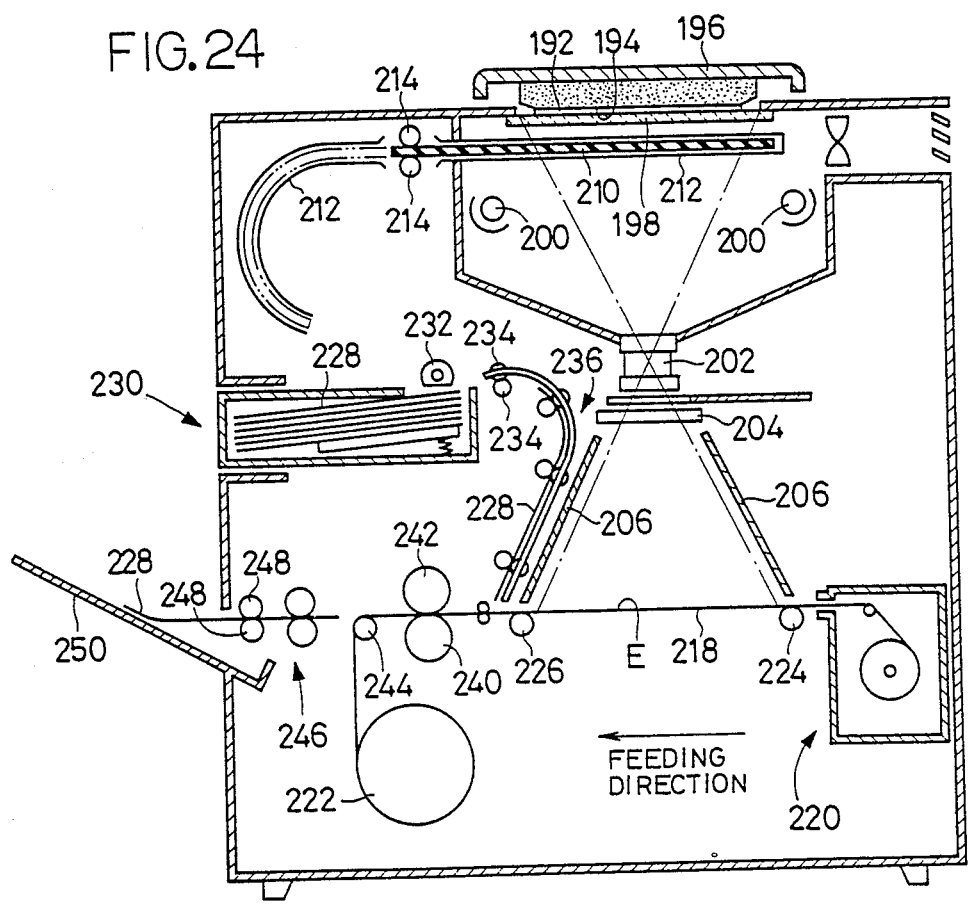
FIG. 24 is a front elevational view in cross section of a further embodiment of an image transfer system of the invention.

Referring to FIG. 24, an original 192 is pressed by a cover 196 such that the original 192 is held in pressed conctact with a glass plate 198. Radiation produced by two illuminating lamps 200 are reflected by an image-bearing surface 194 of the original 192. The reflected light is incident upon an exposing area E of the system, through a lens 202 and a shutter 204, whereby an image on the original 192 is optically focused on the exposing area E. The shutter 204 cooperates with light-shielding hoods 206, to protect the exposing area E from radiation, when the system is not operating to effect a first or second exposing operation which will be described. In the present embodiment, the illuminating lamps 200, lens 202, shutter 204 and light-shielding hoods 206 constitute a major part of an exposing assembly for the first and second exposing operations.

Between the glass plate 198 and the lamps 200, there is disposed a reflector plate 210 in parallel with the glass plate 198. The reflector plate 210 is made from a rubber sheet, and is slidably supported by a pair of slide rails 212 which are fixed at their opposite ends by the frame of the system (now shown). Normally, the reflector plate 210 is placed in its operative or first position of FIG. 24. A pair of rolls 214 are disposed such that the reflector plate 210 is pinched at the upper and lower surfaces by the rolls 214. The reflector plate 210 is moved by the rotating rolls 214 to its inoperative or second position indicated in broken line, in which the plate 210 permits the original 192 to be exposed to the radiations produced by the lamps 200. Described more specifically, the reflector plate 210 is placed in its first position of FIG. 24, when the first exposing operation is effected. In this position, the reflector plate 210 prevents the original 192 from being irradiated by the radiation from the lamps 200. That is, the lower surface of the reflector plate 210 reflects the radiation from the lamps 200, whereby the exposing area E is irradiated by the reflected radiation. When the second exposing operation is performed, the reflector plate 210 is retracted to its second position indicated in broken line in FIG. 24, so that the original 192 is irradiated by the radiations from the lamps 200. In the present embodiment, the reflector plate 210 functions as a reflector member for reflecting the radiations from the lamps 200 before the radiations are incident upon the original 192. Further, the slide rails 212, rolls 214 and a drive and control device for the rolls 214 constitute a device for moving the reflector plate 210 between its first and second positions (operative and inoperative positions).

A roll cassette 220 accommodating a roll of a photosensitive paper web 218, and a take-up roll 222 for winding a used length of the paper web 218 are disposed upstream and downstream of the exposing area E, as seen in the feeding direction of the paper web 218. The photosensitive paper web 218 is fed from the roll cassette 220 by rotation of the take-up roll 222, while being supported and guided by support rolls 224, 226 such that the portion of the paper web 218 in the exposing area E is parallel to the image-bearing surface 194 of the original 192. The photosensitive paper web 218 has a photosensitive surface on one of its opposite surfaces on the side of the illuminating lamps 200. The photosensitive surface has microcapsules which contain a photosensitive resin and a chromogenic material. The microcapsules are cured in a varying degree depending upon the amount of exposure thereof to the light reflected by the image on the image-bearing surface 194 of the original 192. That is, the degree of curing of the microcapsules varies with the density of the corresponding areas of the image on the original 192, whereby a latent image corresponding to the image on the original 192 is formed on the portion of the paper web 218 in the exposing area E. Thus, the paper web 218 serves as a photosensitive medium. With a predetermined length of the paper web 218 taken up by the take-up roll 222, a new portion of the paper web 218 is positioned in the exposing area E.

A recording sheet in the form of a developer sheet 228 having a layer of a developing material is superposed on the exposed portion of the paper web 218 which has passed the exposing area E. The developer sheets 228 are cut sheets of a desired size which are accommodated in a stack in a sheet storage 230, which is removably set in the image transfer system. The developer sheets 228 are delivered by feed roll 232, one at a time, and are fed by a feeding device 236 equipped with feed rolls 234, so that the developer sheet 228 is superposed on the exposed portion of the paper web 218 on which a latent image is formed.

Downstream of the feeding device 236, there are disposed a pair of presser rollers 240, 242 which are adapted to nip and press the superposed paper web 218 and developer sheet 228. With a pressure applied to the exposed portion of the paper web 218, the uncured microcapsules are ruptured, and the chromogenic material (color precursor) flows out of the ruptured microcapsules and chemically reacts with the developing material on the developer sheet 228. Thus, the latent image on the photosensitive paper web 218 is developed into a visible image on the recording sheet in the form of the developer sheet 228. Thus, the presser rollers 240, 242 function as a developing device. The presser rollers 240, 242, which are driven by a suitable drive means, also function as feed rolls for feeding the paper web 218 and recording sheet 228.

Downstream of the presser rollers 240, 242, there is disposed a guide or separator roll 244 for separating the paper web 218 and the recording sheet 228 from each other, and guiding the separated paper web 218 toward the take-up roll 222. Downstream of the separator roll 244, there are provided a pair of heater rolls 246 for heating the recording sheet 228 to a temperature within a suitable range and thereby fixing the formed visible image, and a pair of ejector rolls 248 for feeding the recording sheet 228 with the fixed visible image, into a tray 250 provided at the outlet of the system.

In the present image transfer system, the image on the original 192 is reproduced in the following manner:

Initially, the operator sets the original 192 such that the image-bearing surface 194 is held in close contact with the surface of the glass plate 198. Then, the original 192 is covered by the cover 196. When a start switch (not shown) is turned on with the reflector plate 210 placed in its operative position of FIG. 24, the controller (not shown) activates the illuminating lamps 200 and opens the shutter 204. As a result, the radiations produced by the lamps 200 are reflected by the reflector plate 210, and the portion of the photosensitive paper web 218 in the exposing area E is exposed to the reflected light. Thus, the pre-exposure or first exposing operation is accomplished. In this first exposing operation, the exposure time is determined so that the paper web 218 is exposed by an amount almost equal to a predetermined basic minimum amount indicated at B in the graph of FIG. 25, which shows a photosensitive characteristic of the photosensitive paper web 218. The exposure time is determined by the time during which the reflector plate 210 is held in its first or operative position, or by the time during which the shutter 204 is held open.

After the first exposing operation is completed, the controller activates the feed rolls 214, for retracting the reflector plate 210 to its second or inoperative position indicated in broken line in FIG. 24. In this condition wherein the original 192 and the lamps 200 face each other, the lamps 200 are turned on, so that the paper web 218 is image-wise exposed to the light reflected by the original 192. The amounts of the light reflected by the local areas on the image-bearing surface 194 of the original 192 are influenced by the image densities in the local areas of the image-bearing surface 194, whereby the local areas on the portion of the paper web 218 in the exposing area E are exposed by the amounts corresponding to the local image densities on the image-bearing surface 194 of the original 192. Therefore, a latent image corresponding to the image on the image-bearing surface 194 is formed on the paper web 218. Thus, the image-forming exposing operation or second exposing operation is conducted.

After the portion of the photosensitive paper web 218 in the exposed area E is subjected to the first and second exposing operations, the shutter 204 is closed, and the take-up roll 222 is rotated to feed the paper web 218. In the meantime, the recording sheet or developer sheet 228 is superposed on the exposed portion of the web 218, and the superposed web and developer sheet 218, 228 are passed through the pressure nip between the presser rollers 240, 242. As a result, the uncured microcapsules on the photosensitive paper web 218 are ruptured to permit the chromogenic material to exude to the developer sheet 228, whereby the chromogenic material reacts with the developing material on the developer sheet 228, to develop the latent image on the paper web 218 into a colored visible image on the developer sheet 228. Then, the used portion of the paper web 218 is guided by the separator roll 244 and wound on the take-up roll 222, while the recording sheet or developer sheet 228 is passed through the nip of the heater rolls 246 for fixing the visible image, and is then delivered to the tray 250 by the ejector rolls 248.

Figure 25:
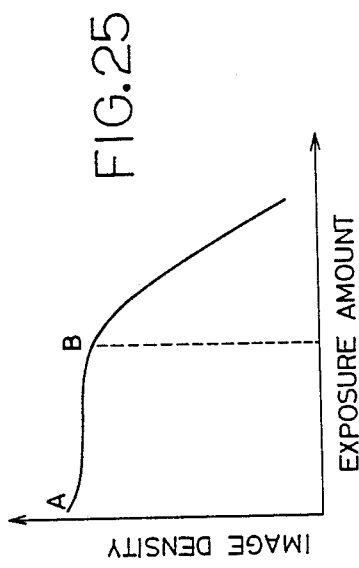
FIG. 25 is a graph indicating a relationship between an amount of light exposure of a photosensitive paper used in the embodiment of FIG. 24 and a density of an image produced on the developed paper.

The instant image transfer system also assures high reproducibility of image density distribution, because of the first exposing operation to pre-expose the photosensitive paper web 218 by the predetermined basic minimum amount indicated at B in FIG. 25.

Figure 28:
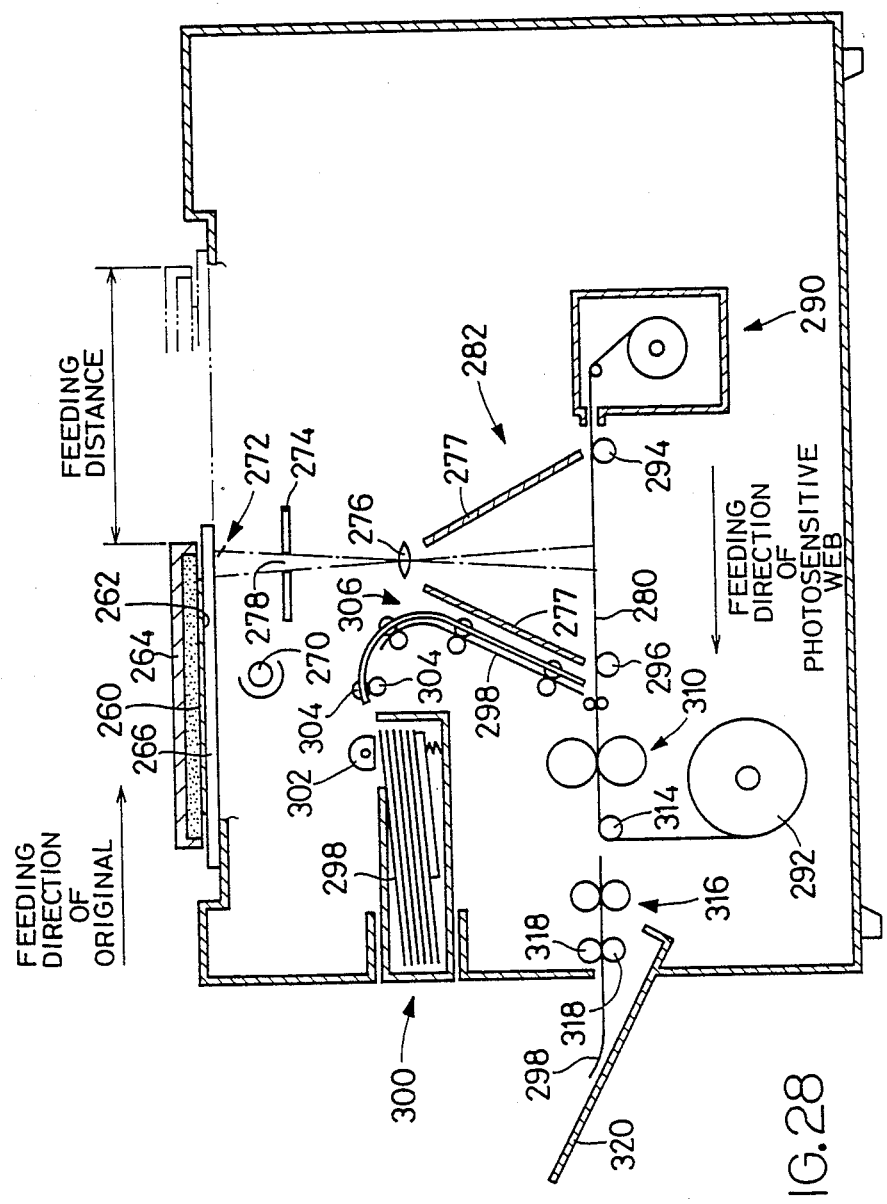
FIG. 28 is a front elevational view in cross section of the image transfer system of FIG. 26.

A further modified embodiment of the image transfer system of the present invention is illustrated in FIG. 28. In the figure, an original 260 is placed on a transparent support plate 266 such that an image-bearing surface 262 is held in pressed contact with the surface of the support plate 266, by a cover 264. The support plate 266 is fed by a feeding device (not shown) in a predetermined feeding direction at a predetermined constant speed, over a distance slightly larger than the length of the original 260.

Below the support plate 266, there are disposed an illuminating lamp 270, a reflector plate 272, a slit plate 274, a lens 276 and light-shielding hoods 277, which are fixed on the frame (not shown) of the image transfer system, in a suitable positional relationship with each other. The reflector plate 272 and a slit 278 in the slit plate 274 extend in the direction perpendicular to the feeding direction of the original 260, i.e., extend in the direction perpendicular to the plane of FIG. 28. The reflector plate 272 is positioned between the support plate 266 and the slit plate 274, and one of opposite sides of the slit 278 remote from the lamp 270.

Radiation generated by the lamp 270 is reflected by the image-bearing surface 262 of the original 260, and by the reflector plate 272. The radiations reflected by the image-bearing surface 262 and the reflector plate 272 both travel through the slit 278 and the lens 276. The slit 278 is positioned so that only the rays of light irregularly reflected by the image-bearing surface 262 pass through the slit 278. The irregularly reflected light rays are focused by the lens 276 on a portion of a photosensitive paper web 280 in a rectangular second exposing area indicated in FIG. 26. This second exposing area, which corresponds to the second exposing operation for image-wise exposing the photosensitive paper web 280, extends in the direction parallel to the slit 278. In this second exposing operation, the microcapsules (containing a photosensitive resin and a chromogenic material or color precursor) in the second exposing area are image-wise exposed to the light rays irregularly reflected by the local areas on the image-bearing surface 262 of the original 260. That is, a latent image is formed on the portion of the web 280 in the second exposing area, by means of different intensities of the light rays irregularly reflected by the local areas of the image-bearing surface 262, which intensities corresponds to the image densities in the local areas of the image-bearing surface 262. Thus, the paper web 280 serves as a photosensitive medium.

The light rays from the lamp 270, which are directly incident upon the reflector plate 272, are regularly reflected by the reflector plate 272 toward the lens 276, through the slit 278, according to the law of reflection. The regularly reflected light rays are focused by the lens 276 on a portion of the photosensitive paper web 280 in a rectangular first exposing area indicated also indicated in FIG. 26, which extends parallel to the slit 278. This first exposing area is located upstream of the second exposing area in the feeding direction of the original 260 (downstream of the second exposing area in the feeding direction of the paper web 280). The first exposing area corresponds to the first exposing operation to pre-expose the paper web 280 by the predetermined constant amount, since the entire second exposing area is irradiated by the light rays regularly reflected by the reflector plate 272, which have substantially the same intensity determined by the intensity of the radiation produced by the lamp 270. In the present embodiment, the reflector plate 272 serves as a reflector member (optical element for reflecting light rays from the lamp 270), and the support plate 266, original feeding device, lamp 270, reflector plate 272, slit plate 274, lens 276 and light-shielding hoods 277 constitute a major portion of an exposing assembly 282 of a scanning type.

The photosensitive paper web 280 is supplied from a roll accommodated in a roll cassette 290 as shown in FIG. 28, and is fed by rotation of a take-up roll 292, in the direction opposite to the feeding direction of the original 260. The paper web 280 is guided by support rolls 294, 296 such that the portion of the web 280 aligned with the exposing assembly 282 is parallel to the image-bearing surface 262 of the original 260. As in the preceding embodiment, a recording sheet in the form of a developer sheet 298 is superposed on the thus exposed portion of the paper web 280. The developer sheet 298 has a developing material capable of chemically reacting with the normally colorless chromogenic material of the microcapsules on the paper web 280. The developer sheets 298 are accommodated in stack in a sheet storage 300, and are delivered from the storage 300 by a feed roll 302, one at a time, and fed by a feeding device 306 equipped with feed rolls 304, so that the delivered developer sheet 298 is superposed on the exposed portion of the paper web 280.

A pair of presser rollers 310 are disposed downstream of the feeding device 306, so that the superposed paper web and developer sheet 280, 298 are pressed by the rolls 310, to develop the latent image on the paper web 280 into a visible image on the recording sheet in the form of the developer sheet 298, as a result of a chemical reaction between the chromogenic material released from the non-cured and ruptured microcapsules on the web 280, and the developing material on the developer sheet 298. Thus, the image on the original 260 is reproduced on the recording sheet 298. In the present embodiment, the presser rollers 310 function as a developing device, and also function as feed rolls for feeding the paper web 280 and recording sheet 298.

A guide or separator roll 314 is provided downstream of the presser rollers 310, for separating the paper web 280 and recording sheet 298 from each other, and guiding the paper web 280 toward the take-up roll 292. Downstream of the separator roll 314, there are disposed heater rolls 316 for fixing the visible image on the recording sheet 298, and ejector rolls 318 for ejecting the recording sheet 298 into a tray 320 at the exit of the system.

When the image on the original 260 is reproduced on the present image transfer system, the original 260 is first set as indicated in FIG. 28, and a start switch (not shown) is turned on. As a result, the lamp 270 is energized, so that the second exposing area is irradiated by the light rays irregularly reflected by the image-bearing surface 262 of the original 260, whose intensities correspond to the image densities in the local areas of the image-bearing surface 262. At the same time, the first exposing area is irradiated by the light rays regularly reflected by the reflector plate 272, which have substantially the same intensity.

Upon energization of the lamp 270, the original feeding device starts feeding the original 260. In synchronization of the feeding movement of the original 260, the presser rollers 310 and the take-up roll 292 are operated to feed the paper web 280. As a result, successive portions of the paper web 280 pass the second and first exposing areas indicated in FIG. 26, whereby the second exposing operation to image-wise expose the paper web 280 occurs in the second exposing area, while the first exposing operation to expose the web 280 by the predetermined basic amount occurs in the first exposing area.

Figure 29:
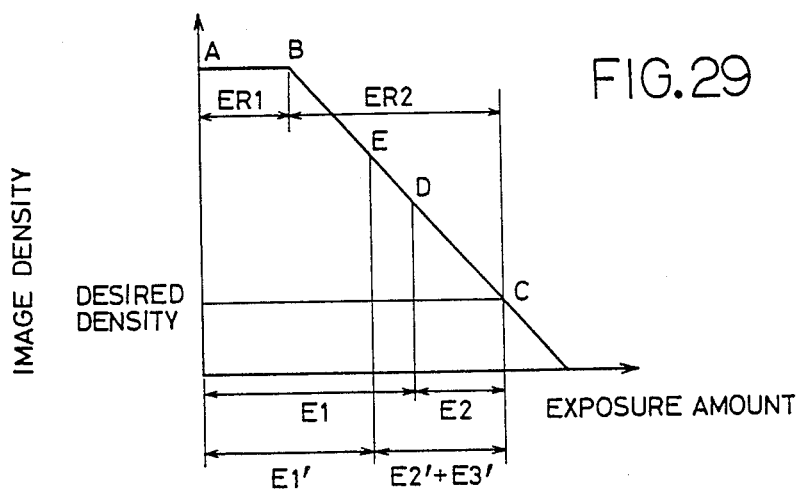
FIG. 29 is a graph showing an amount of light exposure of a photosensitive paper and a density of an image formed on the paper.
Figure 30:
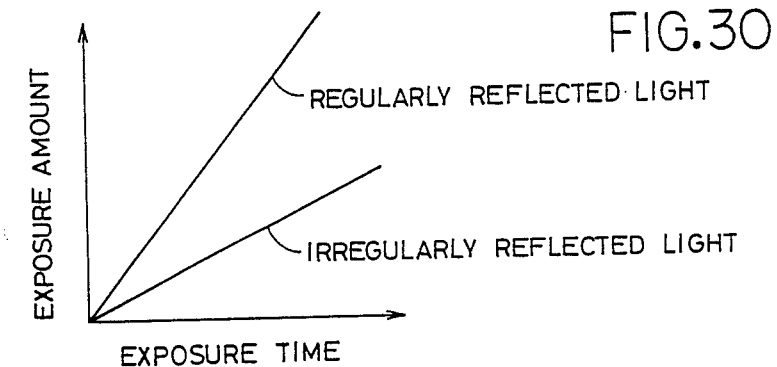
FIGS. 30 through 32 are graphs explaining an exposing operation on the embodiment of FIGS. 26 and 28.
Figure 31:
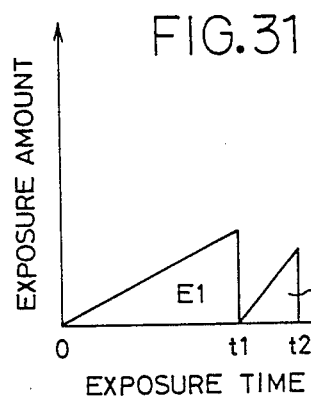

The first and second exposing operations on the photosensitive paper web 280 will be detailed by reference to FIGS. 29–31. In the following description, it is presumed that the exposure amounts of the photosensitive paper web 280 to the irregularly and regularly reflected light rays linearly increase with the exposure time, as indicated in FIG. 30.

Each portion of the photosensitive paper web 280 is first exposed to the irregularly reflected light for a time period t1, whereby an image-forming exposure amount E1 is obtained. Then, the same portion of the web 280 is exposed to the regularly reflected light for a time period (t2−t1), whereby a post-exposure amount E2 is obtained. The image-forming exposure amount E1 varies with the intensity of the irregularly reflected light rays, which varies with the image density in each local area of the image-bearing surface 262. With the varying image-forming exposure amount E1, the density of a visible image obtained by developing a latent image on the photosensitive web 280 varies from Point A to Point D, as indicated in the graph of FIG. 29. Further, the image density varies from Point D to Point C, due to the post-exposure amount E2. Thus, a desired density value is obtained for the density level in each local area on the image-bearing surface 262 of the original 260. The first or basic exposure amount or post-exposure amount E2 is a fixed exposure amount which corresponds to a threshold level ER1 indicated in FIG. 29, below which the image density remains constant, or above which the image density varies with a change in the exposure amount. Accordingly, the basic exposure amount or post-exposure amount E2 contributes to avoiding a variation in the reproducibility of image density distribution on the image-bearing surface 262, between the areas of the photosensitive web 280 exposed to a relatively large amount of the irregularly reflected light, and the areas of the same exposed to a relatively small amount of the irregularly reflected light.

The exposed portion of the paper web 280 on which the latent image corresponding to the image on the image-bearing surface 262 of the original 260 is formed, is fed by the heater rolls 316 and take-up roll 292, away from the exposing assembly 282, and the developer sheet 298 is superposed on the exposed portion of the paper web 280. The superposed web and developer sheet 280, 298 are passed through the pressure nip of the presser rollers 310, for developing the latent image into the visible image. The used portion of the paper web 280 is separated from the developer or recording sheet 298 by the separator roll 314, and only the recording sheet 298 is passed through the nip of the heater rolls 316, so that the visible image is fixed on the sheet 298. It is noted that the exposing operation to form the latent image is completed when the support plate 266 reaches a position indicated in two-dot chain line in FIG. 28, in which the lamp 270 is deenergized.

Figure 26:
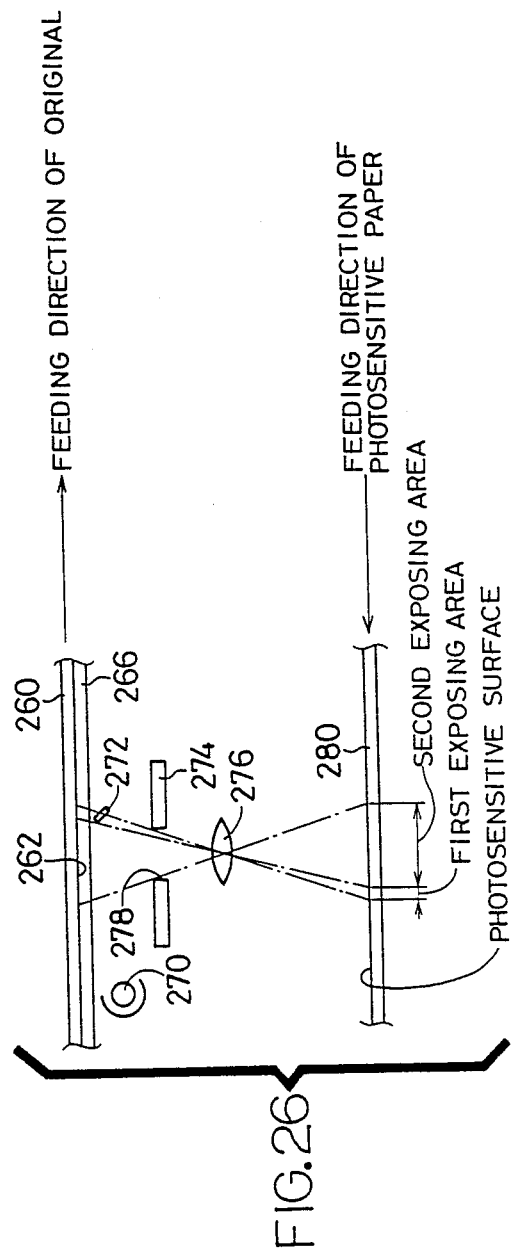
FIG. 26 is a view explaining a positional relationship between an exposing device and a reflector plate of a still further embodiment of the invention.
Figure 27:
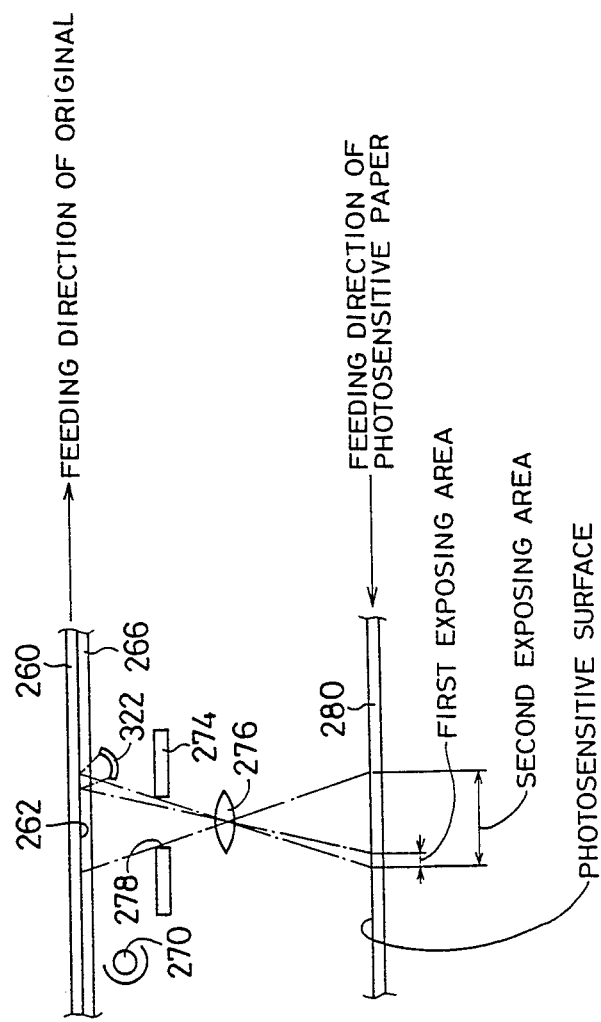
FIG. 27 is a view explaining a positional relationship between an exposing device and a concave mirror used in a yet further embodiment of the invention.

FIG. 27 illustrates a modified reflector member, which is different from the reflector plate 272 used in the embodiment of FIG. 28. In FIG. 27, the same reference numerals as used in FIGS. 26 and 28 are used to identify the corresponding components. The following description refers to only the modified reflector member in the form of a concave mirror 322.

The concave mirror 322 used in in place of the reflector plate 272 is disposed between the original 260 and the slit plate 274. Like the reflector plate 274, this concave mirror 322 is supported by the frame of the system such that the mirror 322 extends parallel to the slit 278 and is positioned on one of opposite sides of the slit 278 remote from the lamp 270.

The concave mirror 322 is located so as not to block the light rays which are irregularly reflected by the image-bearing surface 262 toward the slit 278. In this arrangement, a portion of the paper web 280 in a second exposing area as indicated in FIG. 27 corresponding to a shape and a size of the slit 278 is exposed to the irregularly reflected light rays from the image-bearing surface 262. The concave mirror 322 converges the light rays which are reflected by the image-bearing surface 262, and regularly reflects the converged light rays back to the image-bearing surface 262. The light rays reflected by the concave mirror 322 are regularly reflected by the image-bearing surface 262, and are incident upon the lens 276 through the slit 278. Consequently, a portion of the paper web 280 in a considerably narrow first exposing area as indicated in FIG. 27 is exposed to the regularly reflected light rays from the image-bearing surface 262. This first exposing area is overlapped by a downstream end portion of the second exposing area as viewed in the feeding direction of the web 280. Although it is desirable that the concave mirror 322 receives the regularly reflected rays from the image-bearing surface 262, there is no problem even if the concave mirror 322 receives irregularly reflected light rays from the image-bearing surface 262, which are influenced by the image on the surface 262, provided that the rays reflected by the concave mirror 322 are regularly reflected by the image-bearing surface 262. In this case, the regularly reflected light rays from the surface 262 have substantially the same intensity.

Figure 32:
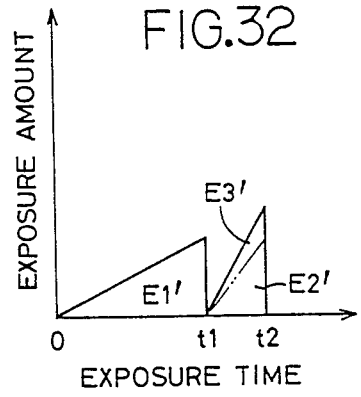

In the present arrangement, each portion of the paper web 280 is first passed through the second exposing area, and then passed through the first exposing area which is overlapped by the downstream end portion of the second exposing area. Referring to FIGS. 29 and 32, each portion of the web 280 is first exposed to the irregularly reflected rays from the image-bearing surface 262 for a time period t1 whereby an image-forming exposure amount E1' is obtained as indicated in FIG. 32. Then, the same portion is exposed to the regularly and irregularly reflected rays for a time period (t2−t1), whereby an auxiliary exposure amount E2' and an image-forming exposure amount E3' are obtained. According to this arrangement, the density of the visible image produced by developing the latent image on the photosensitive web 280 varies from Point A to Point E, due to the image-forming exposure amount E1', as indicated in FIG. 29. Further, the image density varies from Point E to Point C, due to the auxiliary and image-forming exposure amounts E2' and E3'. In the present embodiment, the auxiliary exposure amount E2' is determined to be equal to the threshold level ER1.

In the above two embodiments, the first exposing operation to give the basic or auxiliary exposure amount to the photosensitive web 280 is effected after the second exposing operation to give the image-forming exposure amount, or in the terminal portion of the second exposing operation. However, the first exposing operation may be effected before the second exposing operation, or during the initial portion of the second exposing operation. This modification is possible, if the reflector plate 272 in the embodiment of FIGS. 26, 28 is located on one side of the slit 278 adjacent to the lamp 270, for example, or if the concave mirror 322 in the embodiment of FIG. 27 is modified so that the angle of reflection is appropriately changed, or if the mirror 322 is located on the side of the slit 278 adjacent to the lamp 270. It is also possible that the first exposing area may be provided in an intermediate portion of the second exposing area.

In the above embodiments, a latent image is formed on the photosensitive paper web 280 and a visible image is formed on a separate paper in the form of the developer sheet 298. However, it is possible to use a photosensitive recording medium of a so-called self-activated type, on which both latent and visible images are formed.

While the present invention has been described in its presently preferred embodiments, it is to be understood that the invention is not limited to the precise details of the illustrated embodiments, but may be embodied with various changes and modifications that may occur to those skilled in the art, without departing from the spirit and scope of the invention defined in the following claims.

What is claimed is:

1. A method of exposing a photosensitive medium whose latent image density varies with an amount of exposure to a radiation, after said amount of exposure exceeds a threshold value, comprising:
   a step of providing an original which bears an original image to be reproduced, and a light source which generates radiation;
   a first exposing step of directing said radiation to a photosensitive recording surface of said photosensitive medium, without said radiation passing said original, and evenly exposing said recording surface to said radiation directly from said light source by a predetermined first exposure amount determined by said threshold value; and
   a second exposing step of directing said radiation from said light source to said recording surface of said photosensitive medium, through said original, and thereby exposing said recording surface by a second exposure amount, so that a sum of said first and second exposure amounts of each local area of said recording surface represents a density of a latent image formed on said medium, which corresponds to a density in a corresponding local area of said original.

2. An exposing assembly for exposing a photosensitive medium whose latent image density varies with an amount of exposure to a radiation, after said amount of exposure exceeds a threshold value, comprising:
   a light source which generates a radiation;
   an original having an original image to be reproduced;
   a positioning device for moving said original between a first position spaced away from a path of said radiation between said light source and said photosensitive medium, and a second position aligned with said path of said radiation; and
   a focusing lens disposed in said path of said radiation,
   said positioning device being operated to place said original in said first position for evenly exposing a photosensitive recording surface of said photosensitive medium to said radiation directly from said light source, through said focusing lens, by a predetermined first exposure amount determined by said threshold value, and to place said original in said second position for exposing said recording surface to said radiation which is transmitted through said original, by a second exposure amount, so that a sum of said first and second exposure amounts of each local area of said recording surface represents a density of a latent image formed on said medium, which corresponds to a density in a corresponding local area of said original.

3. An exposing assembly according to claim 2, further comprising a condenser for condensing said radiation from said light source, such that the condensed radiation is incident upon a surface of said original.

4. An exposing assembly according to claim 2, wherein said photosensitive medium exposed by said first and second exposure amounts is superposed on a developer sheet, and the superposed photosensitive medium and developer sheet are passed through a pressure nip of a pair of presser rollers, whereby said latent image is developed into a visible image.

5. An exposing assembly according to claim 2, wherein said photosensitive medium exposed by said first and second exposure amounts is superposed on a recording medium having a layer of a developing material, and the superposed photosensitive and recording media are passed through a nip of a pair of presser rollers, whereby said latent image on said photosensitive medium is developed into a visible image on said recording medium.

6. An exposing assembly for exposing a photosensitive medium to form a latent image thereon, comprising:
   a light source which generates radiation;
   an original bearing an original image corresponding to said latent image; and
   a support member disposed between said light source and said photosensitive medium, for supporting said original, said support member having a first light-transparent portion and a second light-transparent portion which are spaced apart from each other,
   said first light-transparent portion being disposed for effecting a first exposing operation wherein said radiation from said light source is permitted to be transmitted through said first light-transparent portion and directly incident upon a recording surface of said photosensitive medium, without said radiation passing through said original, whereby said recording surface is exposed by a first exposure amount,
   said second light-transparent portion being disposed for effecting a second exposing operation wherein said radiation from said light source is permitted to be transmitted through said second light-transparent portion and through said original, whereby said recording surface is exposed by a second exposure amount, a sum of said first and second exposure amounts of each local area of said recording surface represents a density of said latent image which corresponds to a density in a corresponding local area of said original.

7. An exposing assembly according to claim 6, wherein said photosensitive medium is superposed on a developer sheet, and the superposed photosensitive medium and developer sheet are passed through a presure nip between a pair of presser rollers, such that said latent image on said photosensitive medium is developed into a visible image on said developer sheet.

8. An exposing assembly according to claim 6, wherein said light source consists of a single lamp which is movable in a direction parallel to said support member.

9. An exposing assembly for exposing a photosensitive medium to form a latent image thereon, comprising:
- an original having an original image corresponding to said latent image;
- a light source for generating radiation for irradiating a surface of said original;
- an optical system for exposing a recording surface of said photosensitive medium to said radiation reflected by said surface of said original, for forming said latent image on said recording surface;
- a reflector member disposed between said original and said light source, and movable between a first position in which said reflector member reflects said radiation from said light source and thereby expose said recording surface by a first exposure amount, and a second position in which said reflector member permits said radiation from said light source to be reflected by said original, whereby said recording surface is exposed to the radiation reflected by said original by a second exposure amount; and
- a positioning device for moving said reflector member between said first and second positions.

10. An exposing assembly according to claim 9, wherein said first exposure amount obtained with said reflector member placed in said first position is substantially equal to a basic minimum amount below which a density of a visible image obtained by development of said latent image remains constant and above which the density of said visible image varies with an amount of exposure to the radiation, and said second exposure amount obtained with said reflector member placed in said second position differs between local areas of said recording surface of said photosensitive medium, depending upon densities in corresponding local areas of said original image on said original.

11. An image transfer system for forming a latent image on a photosensitive medium according to an original image, and developing said latent image into a visible image, comprising:
- an original having an image-bearing surface which bears said original image;
- a light source which produces a radiation for irradiating said image-bearing surface of said original;
- a feeding device for moving said original and said light source relative to each other in a predetermined feeding direction;
- a slit plate which is disposed between said original and said photosensitive medium and which has a slit which extends in a direction perpendicular to said feeding direction, said slit being positioned relative to said light source so that light rays of said radiation which are irregularly reflected by said image-bearing surface of said original are transmitted through said slit, whereby an image-forming exposing area is irradiated by said irregularly reflected light rays from said image-bearing surface of said original, a recording surface of said photosensitive medium being exposed to said irregularly reflected light rays while said photosensitive medium is passed through said image-forming exposing area; and
- an optical device including a reflector member disposed between said original and said slit plate, so as to extend parallel to said slit, said reflector member being positioned relative to said slit so that said reflector member regularly reflects light rays of said radiation from said light source such that the regularly reflected light rays from said reflector member are transmitted through said slit, whereby an auxiliary exposing area is irradiated by said regularly reflected light rays from said reflector member, said recording surface of said photosensitive medium being exposed to said regularly reflected light rays while said photosensitive medium is passed through said auxiliary exposing area,
- said recording surface of said photosensitive medium is evenly exposed in said auxiliary exposing area by a first exposure amount determined by a basic minimum amount below which a density of said visible image remains constant, and each local area of said recording surface is exposed in said image-forming exposing area by a second exposure amount which varies with a density in a corresponding area of said original image on said image-bearing surface of said original.

12. An image transfer system for forming a latent image on a photosensitive medium according to an original image, and developing said latent image into a visible image, comprising:
- an original having an image-bearing surace which bears said original image;
- a light source which produces a radiation for irradiating said image-bearing surface of said original;
- a feeding device for moving said original and said light source relative to each other in a predetermined feeding direction;
- a slit plate which is disposed between said original and said photosensitive medium and which has a slit which extends in a direction perpendicular to said feeding direction, said slit being positioned relative to said light source so that light rays of said radiation which are irregularly reflected by said image-bearing surface of said original are transmitted through said slit, whereby an image-forming exposing area is irradiated by said irregularly reflected light rays from said image-bearing surface of said original, a recording surface of said photosensitive medium being exposed to said irregularly reflected light rays while said photosensitive medium is passed through said image-forming exposing area; and
- an optical device including a reflector member disposed between said original and said slit plate, so as to extend parallel to said slit, said reflector member being positioned relative to said slit so that said reflector member reflects light rays of said radiation which are regularly reflected by said image-bearing surface of said original, such that the reflected light rays from said reflector member are again regularly reflected by said image-bearing surface and transmitted through said slit, whereby an auxiliary exposing area is irradiated by said regularly reflected light rays from said image-bearing surface, said recording surface of said photosensitive medium being exposed to said regularly reflected light rays from said image-bearing surface while said photosensitive medium is passed through said auxiliary exposing area, said recording surface of said photosensitive medium is evenly exposed in said auxiliary exposing area by a first exposure amount determined by a basic minimum amount below which a density of said visible image remains constant, and each local area of said recording surface is exposed in said image-forming exposing area by a second exposure amount which varies with a density in a corresponding area of said original image on said image-bearing surface of said original.

* * * * *